(12) United States Patent
Chen

(10) Patent No.: US 12,035,104 B2
(45) Date of Patent: Jul. 9, 2024

(54) BARRIER LAYER ON A PIEZOELECTRIC-DEVICE PAD

(71) Applicant: Taiwan Semiconductor Manufacturing Company, Ltd., Hsinchu (TW)

(72) Inventor: Chih-Ming Chen, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 226 days.

(21) Appl. No.: 17/577,715

(22) Filed: Jan. 18, 2022

(65) Prior Publication Data

US 2023/0037116 A1 Feb. 2, 2023

Related U.S. Application Data

(60) Provisional application No. 63/228,275, filed on Aug. 2, 2021.

(51) Int. Cl.
| | |
|---|---|
| *H04R 25/00* | (2006.01) |
| *H04R 17/00* | (2006.01) |
| *H04R 31/00* | (2006.01) |
| *H10N 30/06* | (2023.01) |
| *H10N 30/87* | (2023.01) |
| *H10N 30/88* | (2023.01) |

(52) U.S. Cl.
CPC .............. *H04R 17/00* (2013.01); *H04R 31/00* (2013.01); *H10N 30/06* (2023.02); *H10N 30/875* (2023.02); *H10N 30/883* (2023.02)

(58) Field of Classification Search
CPC .... H04R 19/04; H04R 31/006; H04R 19/005; H04R 29/004; H04R 17/02
See application file for complete search history.

(56) References Cited

U.S. PATENT DOCUMENTS

| | | | |
|---|---|---|---|
| 6,347,147 B1* | 2/2002 | Downs, Jr. | ............. H04R 17/02 381/114 |
| 10,115,883 B2 | 10/2018 | Iida | |
| 2015/0215706 A1 | 7/2015 | Sparks et al. | |
| 2020/0006470 A1 | 1/2020 | Chang et al. | |
| 2021/0043721 A1* | 2/2021 | Shih | ........................ H01L 28/75 |

\* cited by examiner

*Primary Examiner* — Amir H Etesam
(74) *Attorney, Agent, or Firm* — Eschweiler & Potashnik, LLC

(57) ABSTRACT

Various embodiments of the present disclosure are directed towards an integrated circuit (IC) chip in which a pad barrier layer caps a pad of a piezoelectric device. The pad barrier layer is configured to block hydrogen ions and/or other errant materials from diffusing to the piezoelectric layer. Absent the pad barrier layer, hydrogen ions from hydrogen-ion containing processes performed after forming the pad may diffuse to the piezoelectric layer along a via extending from the pad to the piezoelectric device. By blocking diffusion of hydrogen ions and/or other errant materials to the piezoelectric device, the pad barrier layer may prevent delamination and breakdown of the piezoelectric layer. Hence, the pad barrier layer may prevent failure of the piezoelectric device.

20 Claims, 21 Drawing Sheets

BARRIER LAYER ON A PIEZOELECTRIC-DEVICE PAD

REFERENCE TO RELATED APPLICATION

This application claims the benefit of U.S. Provisional Application No. 63/228,275, filed on Aug. 2, 2021, the contents of which are incorporated by reference in their entirety.

BACKGROUND

Piezoelectric actuators and other suitable piezoelectric devices may create physical movement in response to an electrical signal. The physical movement may be used to control various kinds of mechanical and optical systems. For example, the physical movement may be used to control movement of a moveable membrane to create a speaker.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
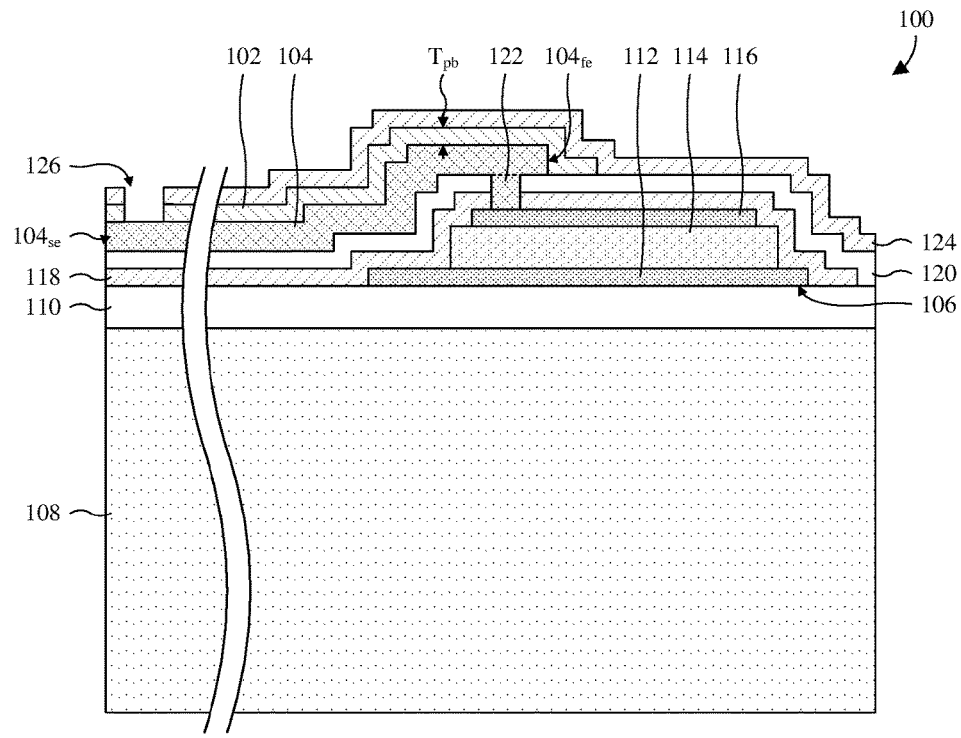
FIG. 1 illustrates a cross-sectional view of some embodiments of an integrated circuit (IC) chip in which a barrier layer caps a pad of a piezoelectric device.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A piezoelectric actuator or some other suitable piezoelectric device may comprise a bottom electrode, a piezoelectric layer overlying the bottom electrode, and a top electrode overlying the piezoelectric layer. A top-electrode pad overlies and is electrically coupled to the top electrode by a top-electrode via extending from the top-electrode pad to the top electrode. A bottom-electrode pad overlies and is electrically coupled to the bottom electrode by a bottom-electrode via extending from the bottom-electrode pad to the bottom electrode.

A challenge with the piezoelectric device is that hydrogen-ion containing processes may be employed after forming the piezoelectric layer. Further, the top-electrode and bottom-electrode vias may provide diffusion paths for hydrogen ions from the hydrogen-ion containing processes to diffuse to the piezoelectric layer. Hydrogen ions that diffuse to the piezoelectric layer may accumulate in the piezoelectric layer and induce delamination and breakdown of the piezoelectric layer, whereby the piezoelectric device may fail.

Various embodiments of the present disclosure are directed towards an integrated circuit (IC) chip in which a pad barrier layer caps a pad of a piezoelectric device. The pad barrier layer is configured to block hydrogen ions and/or other errant materials from diffusing to the piezoelectric layer. Absent the pad barrier layer, hydrogen ions from hydrogen-ion containing processes performed after forming the pad may diffuse to the piezoelectric layer along a via extending from the pad to the piezoelectric device. By blocking diffusion of hydrogen ions and/or other errant materials to the piezoelectric device, the pad barrier layer may prevent delamination and breakdown of the piezoelectric layer. Hence, the pad barrier layer may prevent failure of the piezoelectric device.

With reference to FIG. 1, a cross-sectional view 100 of some embodiments of an IC chip is provided in which a pad barrier layer 102 caps a pad 104 of a piezoelectric device 106. The piezoelectric device 106 overlies a substrate 108 and is separated from the substrate 108 by a substrate dielectric layer 110. Further, the piezoelectric device 106 comprises a bottom electrode 112, a piezoelectric layer 114 overlying the bottom electrode 112, and a top electrode 116 overlying the piezoelectric layer 114. In some embodiments, the piezoelectric device 106 is an actuator, but other suitable types of piezoelectric device are amenable. In some embodiments, the piezoelectric device 106 may also be referred to as a metal-piezoelectric-metal (MPM) structure and/or, a piezoelectric structure.

A device barrier layer 118 and a device dielectric layer 120 overlie the piezoelectric device 106 and are stacked between the piezoelectric device 106 and the pad 104. The device barrier layer 118 separates the device dielectric layer 120 from the piezoelectric device 106 and is configured to block hydrogen ions and/or other suitable errant materials from diffusing to the piezoelectric layer 114 from over the device barrier layer 118. In some embodiments, the device barrier layer 118 may be regarded as a hydrogen-barrier layer.

The pad 104 overlies the device barrier layer 118 and comprises a first end $104_{fe}$ and a second end $104_{se}$. The first end $104_{fe}$ overlies the top electrode 116, and a via 122 extends from the first end $104_{fe}$, through the device barrier layer 118 and the device dielectric layer 120, to the top electrode 116. In alternative embodiments, the via 122 extends to the bottom electrode 112 instead of the top electrode 116. The second end $104_{se}$ is distal from the first end $104_{fe}$ and is laterally offset from the piezoelectric device 106.

The pad barrier layer 102 caps the pad 104, and a passivation layer 124 caps the pad barrier layer 102 and the device dielectric layer 120. Further, a pad opening 126 extends through the pad barrier layer 102 and the passivation layer 124 to expose the second end 104se of the pad 104. Similar to the device barrier layer 118, the pad barrier layer 102 is configured to block hydrogen ions and/or other suitable errant materials from diffusing to the piezoelectric device 106 from over the pad 104. In some embodiments, the pad barrier layer 102 may be regarded as a hydrogen-barrier layer. Absent the pad barrier layer 102, hydrogen ions from hydrogen-containing semiconductor manufacturing processes performed after forming the pad 104 may diffuse to the piezoelectric layer 114 along the via 122.

Hydrogen ions that diffuse to the piezoelectric layer 114 may accumulate in the piezoelectric layer 114 and induce delamination and breakdown of the piezoelectric layer 114, whereby the piezoelectric device 106 may fail. Therefore, by blocking diffusion of hydrogen ions to the piezoelectric layer 114, the pad barrier layer 102 and the device barrier layer 118 may prevent delamination and breakdown of the piezoelectric layer 114. Hence, the pad barrier layer 102 and the device barrier layer 118 may prevent failure of the piezoelectric device 106.

Because the pad opening 126 extends through the pad barrier layer 102, hydrogen ions and/or other errant materials may extend through the pad barrier layer 102. However, because the pad opening 126 is at the second end $104_{se}$ of the pad 104, laterally offset from the piezoelectric device 106, the diffusion path from the pad opening 126 to the piezoelectric layer 114 may be long. Hence, the likelihood of hydrogen ions and/or other errant materials diffusing to the piezoelectric layer 114 from the pad opening 126 may be low.

In some embodiments, a thickness $T_{pb}$ of the pad barrier layer 102 is about 200-600 angstroms, about 200-400 angstroms, about 400-600 angstroms, or some other suitable value. If the thickness $T_{pb}$ is too small (e.g., less than about 200 angstroms), the pad barrier layer 102 may be unable to block diffusion of hydrogen ions and/or other errant materials through the pad barrier layer 102. If the thickness $T_{pb}$ is too large (e.g., more than about 600 angstroms), material may be wasted and high topographical variation at the pad barrier layer 102 may present processing challenges that reduce manufacturing yields.

In some embodiments, the pad barrier layer 102 is crystalline and/or has a density greater than about 2 grams per cubic centimeter (g/cm$^3$), 2.6 g/cm$^3$, 5 g/cm$^3$, or some other suitable value. It has been appreciated that such a density may block diffusion of hydrogen ions and/or other errant materials through the pad barrier layer 102.

In some embodiments, the pad barrier layer 102 is a metal oxide or some other suitable material. The metal oxide may, for example, be or comprise aluminum oxide (e.g., $Al_2O_3$), titanium oxide (e.g., $TiO_2$), iron oxide (e.g., $Fe_2O_3$), zirconium oxide (e.g., $ZrO_2$), zinc oxide (e.g., ZnO), copper oxide (e.g., CuO), tantalum oxide (e.g., $Ta_2O_5$), some other suitable type of metal oxide, or any combination of the foregoing. In some embodiments, the pad barrier layer 102 is dielectric. In some embodiments, during formation of the IC chip, the pad barrier layer 102 is deposited by a process that does not depend on hydrogen ions and/or other errant materials. For example, the pad barrier layer 102 may be deposited by physical vapor deposition (PVD) or some other suitable type of deposition.

In some embodiments, the device barrier layer 118 is a same material as the pad barrier layer 102. In other embodiments, the device barrier layer 118 is a different material than the pad barrier layer 102. In some embodiments, the device barrier layer 118 is crystalline and/or has a density greater than about 2 g/cm$^3$, 2.6 g/cm$^3$, 5 g/cm$^3$, or some other suitable value. In some embodiments, the density is the same as that of the pad barrier layer 102. In some embodiments, the device barrier layer 118 is dielectric.

In some embodiments, the substrate 108 is a bulk substrate of silicon or some other suitable type of semiconductor material. In other embodiments, the substrate 108 is a semiconductor-on-insulator (SOI) substrate or some other suitable type of semiconductor substrate. To the extent that the substrate 108 is an SOI substrate, the semiconductor material of the SOI substrate may be silicon or some other suitable type of semiconductor material.

In some embodiments, the substrate dielectric layer 110 is or comprises silicon oxide and/or some other suitable dielectric(s). In some embodiments, the device dielectric layer 120 is or comprises silicon oxide and/or some other suitable dielectric(s). In some embodiments, the substrate dielectric layer 110 and the device dielectric layer 120 are or comprise a same material. In other embodiments, the substrate dielectric layer 110 and the device dielectric layer are or comprise different materials. In some embodiments, the passivation layer 124 is or comprise silicon nitride and/or some other suitable dielectric(s).

In some embodiments, a rate of diffusion of hydrogen ions through and/or in the pad barrier layer 102 is less than: 1) a rate of diffusion of hydrogen ions through and/or in the substrate dielectric layer 110; 2) a rate of diffusion of hydrogen ions through and/or in the device dielectric layer 120; 3) a rate of diffusion of hydrogen ions through and/or in the pad 104; 4) a rate of diffusion of hydrogen ions through and/or in the passivation layer 124; or 5) any combination of the foregoing. Similarly, in some embodiments, a rate of diffusion of hydrogen ions through and/or in the device barrier layer 118 is less than: 1) a rate of diffusion of hydrogen ions through and/or in the substrate dielectric layer 110; 2) a rate of diffusion of hydrogen ions through and/or in the device dielectric layer 120; 3) a rate of diffusion of hydrogen ions through and/or in the pad 104; 4)

a rate of diffusion of hydrogen ions through and/or in the passivation layer 124; or 5) any combination of the foregoing. The rates of the pad barrier layer 102 and/or the device barrier layer 118 may, for example, be zero or close to zero.

In some embodiments, the piezoelectric layer 114 is or comprises lead zirconate titanate (e.g., PZT) and/or some other suitable piezoelectric material(s). In some embodiments, the bottom electrode 112 is or comprises titanium oxide, platinum, some other suitable metal(s) or conductive material(s), or any combination of the foregoing. In some embodiments, the top electrode 116 is or comprises titanium oxide, platinum, some other suitable metal(s) or conductive material(s), or any combination of the foregoing. In some embodiments, the bottom and top electrodes 112, 116 are or comprise a same material. In other embodiments, the bottom and top electrodes 112, 116 are or comprise different materials.

In some embodiments, the pad 104 is or comprises copper, aluminum copper, aluminum, some other suitable metal(s) or conductive material(s), or any combination of the foregoing. In some embodiments, the device barrier layer 118 is configured to block material of the pad 104 from diffusing from the pad 104 to the piezoelectric device 106. Such material may, for example, be or comprise copper and/or some other suitable material.

In some embodiments, while not shown, a bump structure, a wire bond structure, or some other suitable type of conductive structure is formed in the pad opening 126 to electrically couple the pad 104 and hence the piezoelectric device 106 to another IC chip, a printed circuit board (PCB), an interposer structure, or some other suitable structure.

Figure 2:
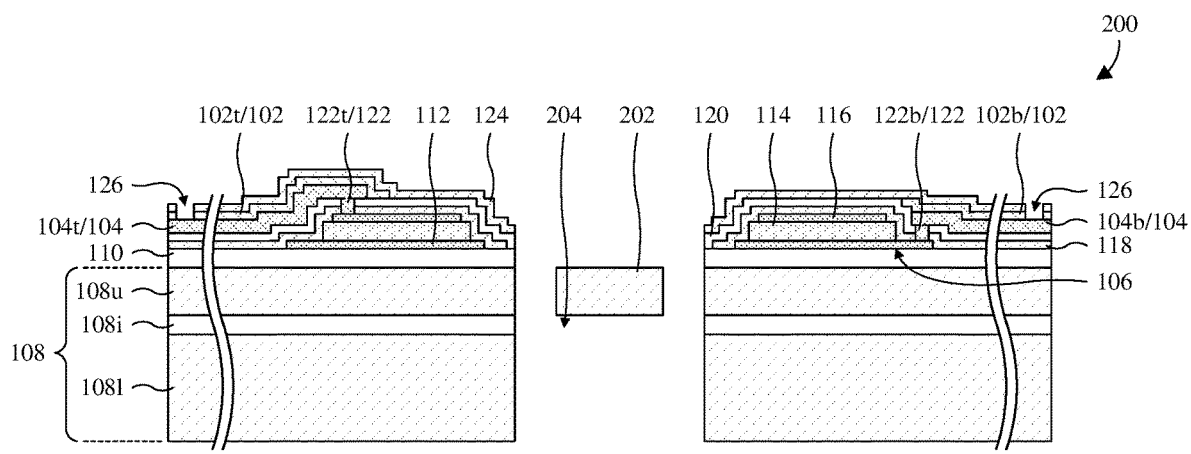
FIG. 2 illustrates an expanded cross-sectional view of some embodiments of the IC chip of FIG. 1 in which the piezoelectric device surrounds a membrane.

With reference to FIG. 2, an expanded cross-sectional view 200 of some embodiments of the IC chip of FIG. 1 is provided in which the piezoelectric device 106 surrounds a membrane 202. Upon application of a voltage from the top electrode 116 to the bottom electrode 112, the piezoelectric device 106 vibrates, thereby causing the membrane 202 to move within a sound opening 204. As such, the membrane 202 and the piezoelectric device 106 collectively form a piezoelectric speaker or some other suitable structure.

A pair of pads 104 and a pair of vias 122 electrically couple to the piezoelectric device 106. The pair of pads 104 comprises a top-electrode pad 104t and a bottom-electrode pad 104b, and the pair of vias 122 comprises a top-electrode via 122t and a bottom-electrode via 122b. The top-electrode pad 104t and the top-electrode via 122t correspond to the pad 104 and the via 122 illustrated and described with regard to FIG. 1. The bottom-electrode pad 104b and the bottom-electrode via 122b are on an opposite side of the sound opening 204 as the top-electrode pad 104t and the top-electrode via 122t. Further, the bottom-electrode via 122b extends from the bottom-electrode pad 104b to the bottom electrode 112.

The pad barrier layer 102 caps both of the pads 104 and comprises a top-electrode barrier segment 102t and a bottom-electrode barrier segment 102b. The top-electrode barrier segment 102t caps the top-electrode pad 104t, whereas the bottom-electrode barrier segment 102b caps the bottom-electrode pad 104b.

By capping the pads 104, the pad barrier layer 102 prevents hydrogen ions and/or other errant particles from diffusing to the piezoelectric device 106 from over the top-electrode pad 104t and the bottom-electrode pad 104b. Absent the pad barrier layer 102, hydrogen ions from hydrogen-containing semiconductor manufacturing processes performed after forming the top-electrode pad 104t and the bottom-electrode pad 104b may diffuse to the piezoelectric layer 114 along the top-electrode via 122t and/or along the bottom-electrode via 122b. This may induce delamination and breakdown of the piezoelectric layer 114, whereby the piezoelectric device 106 may fail. Therefore, by blocking diffusion of hydrogen ions to the piezoelectric layer 114, the pad barrier layer 102 may prevent failure of the piezoelectric device 106.

A pair of pad openings 126 respectively expose the pads 104 respectively at locations laterally offset from the piezoelectric device 106, whereby diffusion paths from the pad openings 126 to the piezoelectric layer 114 may be long. Because the diffusion paths may be long, the likelihood of hydrogen ions and/or other errant materials diffusing to the piezoelectric layer 114 from the pad openings 126 may be low.

The substrate 108 is an SOI substrate and comprises a lower semiconductor layer 108l, an insulator layer 108i overlying the lower semiconductor layer 108l, and an upper semiconductor layer 108u overlying the insulator layer 108i. In some embodiments, the insulator layer 108i is or comprises silicon oxide and/or some other suitable dielectric(s). In some embodiments, the lower semiconductor layer 108l and the upper semiconductor layers 108u are or comprise silicon and/or some other suitable semiconductor(s).

The membrane 202 corresponds to a portion of the upper semiconductor layer 108u and is connected to a remainder of the upper semiconductor layer 108u outside the cross-sectional view 200 of FIG. 2. Further, as described above, the membrane 202 moves in the sound opening 204 in response to vibrations from the piezoelectric device 106. As such, the piezoelectric device 106 may also be regarded as a piezoelectric actuator or some other suitable type of piezoelectric device, and the piezoelectric device 106 and the membrane 202 may collectively form a piezoelectric speaker.

The sound opening 204 extends through the substrate 108, the substrate dielectric layer 110, the device dielectric layer 120, and the passivation layer 124. Further, the substrate 108, the substrate dielectric layer 110, the device dielectric layer 120, and passivation layer 124 form a common sidewall in the sound opening 204. In alternative embodiments, the device dielectric layer 120 and/or the passivation layer 124 do not form the common sidewall, and/or the device barrier layer 118 further forms the common sidewall.

Figure 3:
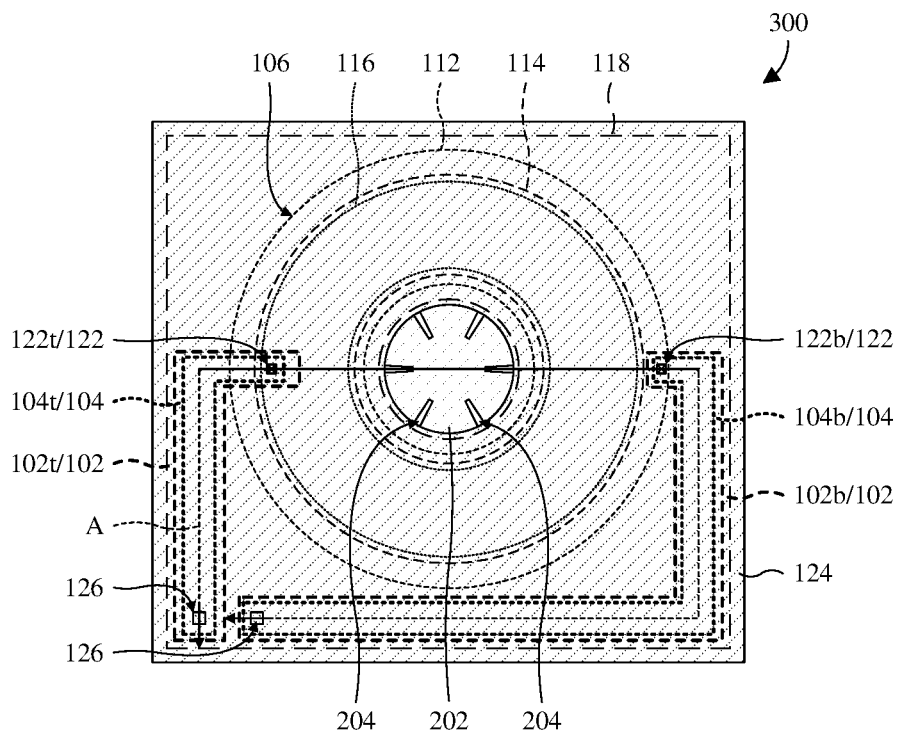
FIG. 3 illustrates a top layout view of some embodiments of the IC chip of FIG. 2.

With reference to FIG. 3, a top layout view 300 of some embodiments of the IC chip of FIG. 2 is provided. The cross-sectional view 200 of FIG. 2 may, for example, be taken along line A, and the portions of the IC chip illustrated in the cross-sectional view 200 of FIG. 2 may, for example, correspond to solid portions of line A.

The membrane 202 has a circular top geometry, and the sound opening 204 has six slit-shaped segments. The slit-shaped segments extend through the membrane 202 (see the cross-sectional view 200 of FIG. 2) and are evenly spaced circumferentially around the membrane 202 respectively at 0 degrees, 60 degrees, 120 degrees, 180 degrees, 240 degrees, and 300 degrees. In other embodiments, the slit-shaped segments may be unevenly spaced circumferentially around the membrane 202. Further, in other embodiments, the sound opening 204 has more or less slit-shaped segments. For example, the sound opening 204 may have 8, 12, or some other suitable number of slit-shaped segments.

The piezoelectric device 106 (constituents of which are shown in phantom) has a ring-shaped top geometry that extends in a closed path around the membrane 202. In alternative embodiments, the piezoelectric device 106 has some other suitable top geometry. Further, the top-electrode pad 104t and the bottom-electrode pad 104b (both shown in phantom) extend respectively from the top-electrode via 122t and the bottom-electrode via 122b respectively to locations laterally offset from the piezoelectric device 106.

The top-electrode and bottom-electrode barrier segments 102t, 102b (collectively the barrier segments 102t, 102b) of the pad barrier layer 102 are individual to and respectively overlap with the top-electrode pad 104t and the bottom-electrode pad 104b. Further, the barrier segments 102t, 102b have top geometrical shapes that respectively match top geometrical shapes of the top-electrode pad 104t and the bottom-electrode pad 104b. For example, the barrier segments 102t, 102b, as well as the top-electrode pad 104t and the bottom-electrode pad 104b, may have L-shaped top geometrical shapes or other suitable top geometrical shapes. In alternative embodiments, the barrier segments 102t, 102b have top geometrical shapes different than those of the top-electrode pad 104t and the bottom-electrode pad 104b.

Figure 4A:
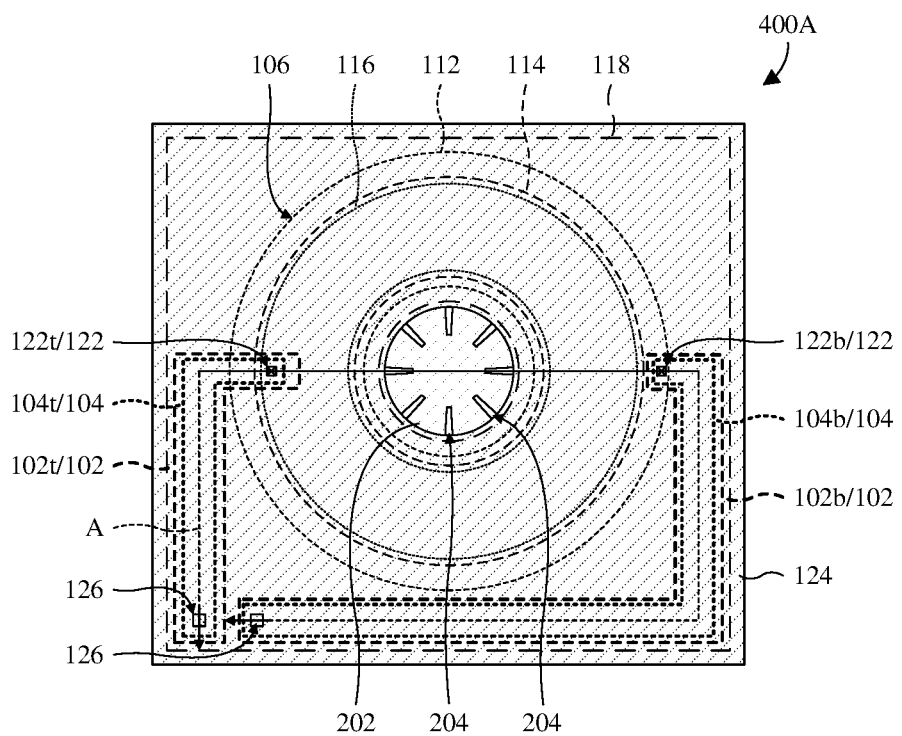
FIGS. 4A and 4B illustrate top layout views of some alternative embodiments of the IC chip of FIG. 3.
Figure 4B:
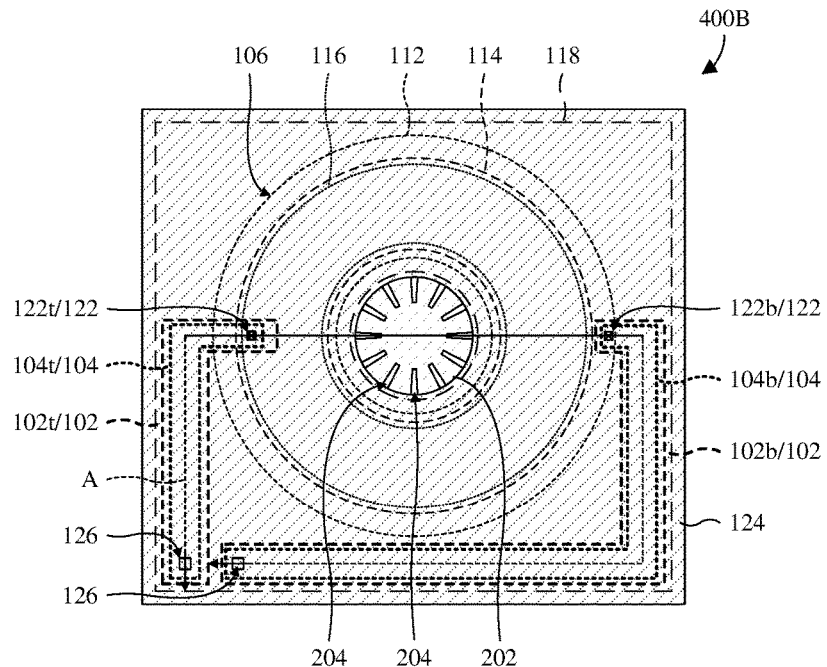

While the sound opening 204 is illustrated with six slit-shaped segments circumferentially spaced around the membrane 202, more or less slit-shaped segments are amenable. For example, with reference to FIGS. 4A and 4B, top layout views 400A, 400B of some alternative embodiments of the IC chip of FIG. 3 are provided in which the number of slit-shaped segments is varied. In FIG. 4A, the sound opening 204 has eight slit-shaped segments. In FIG. 4B, the sound opening 204 has twelve slit-shaped segments.

With reference to FIGS. 5A-5G, cross-sectional views 500A-500G of some alternative embodiments of the IC chip of FIG. 2 are provided.

Figure 5A:
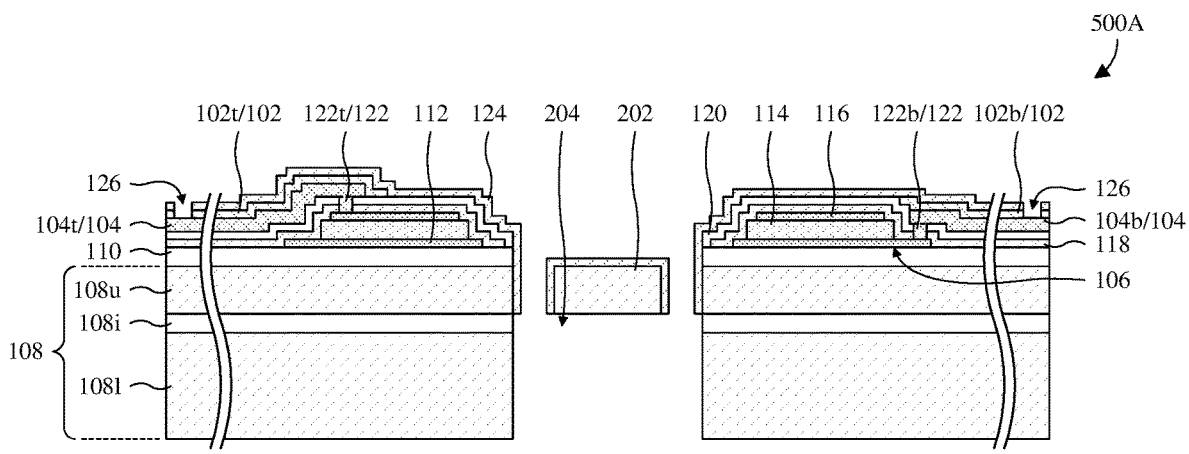
FIGS. 5A-5G illustrate cross-sectional views of some alternative embodiments of the IC chip of FIG. 2.

In FIG. 5A, the passivation layer 124 is on sidewalls of the membrane 202 and a top surface of the membrane 202. Further, the passivation layer 124 lines a common sidewall formed by the upper semiconductor layer 108u, the substrate dielectric layer 110, and the device dielectric layer 120. This may change the rigidity of the membrane 202, whereby the membrane 202 may vibrate differently during use of the piezoelectric speaker collectively formed by the membrane 202 and the piezoelectric device 106.

Figure 5B:
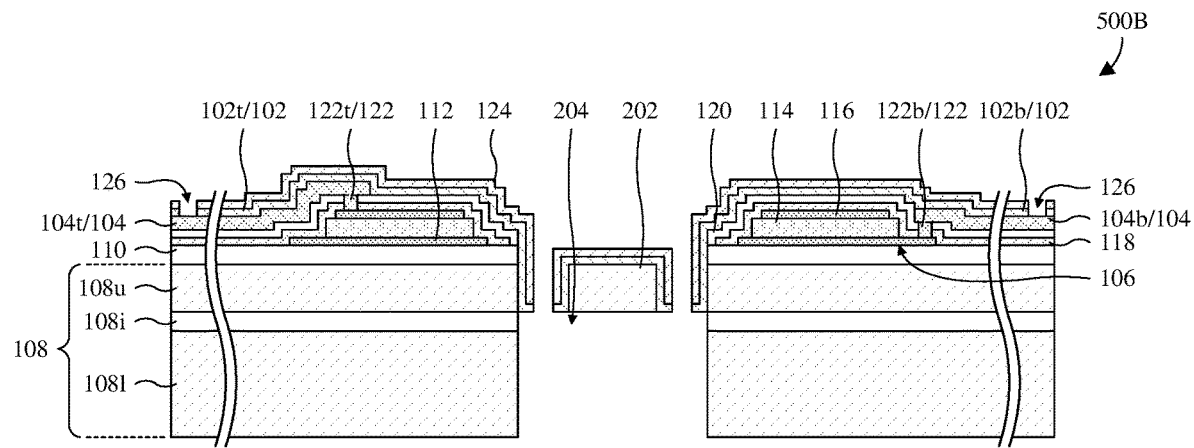

In FIG. 5B, the passivation layer 124 and the pad barrier layer 102 are both on sidewalls of the membrane 202 and a top surface of the membrane 202. Further, the passivation layer 124 and the pad barrier layer 102 both line a common sidewall formed by the upper semiconductor layer 108u, the substrate dielectric layer 110, and the device dielectric layer 120. This may change the rigidity of the membrane 202, whereby the membrane 202 may vibrate differently during use of the piezoelectric speaker collectively formed by the membrane 202 and the piezoelectric device 106. In some embodiments, the top-electrode and bottom-electrode barrier segments 102t, 102b of the pad barrier layer 102 are connected outside the cross-sectional view 500B of FIG. 5B.

Figure 5C:
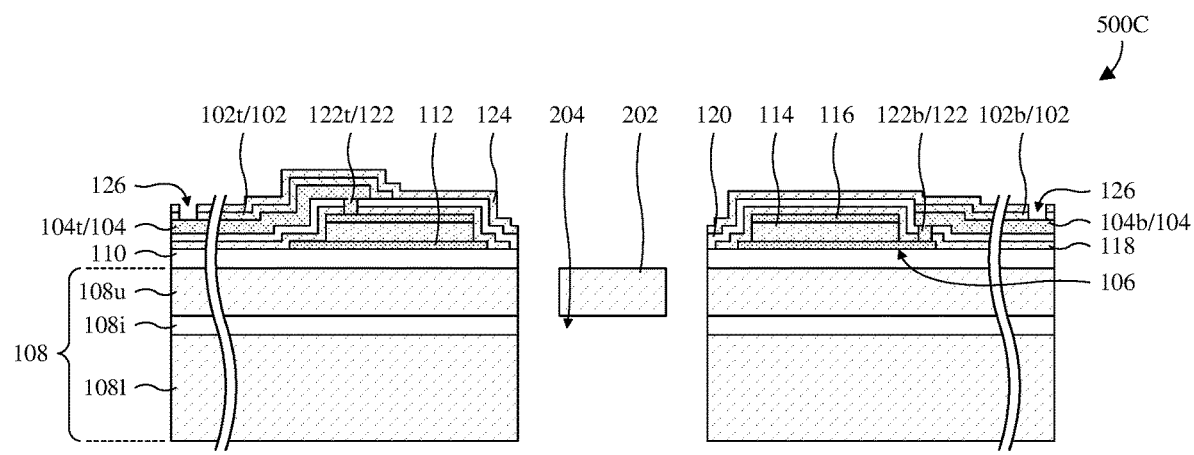

In FIG. 5C, the top electrode 116 and the piezoelectric layer 114 form common sidewalls and share a common width less than that of the bottom electrode 112.

Figure 5D:
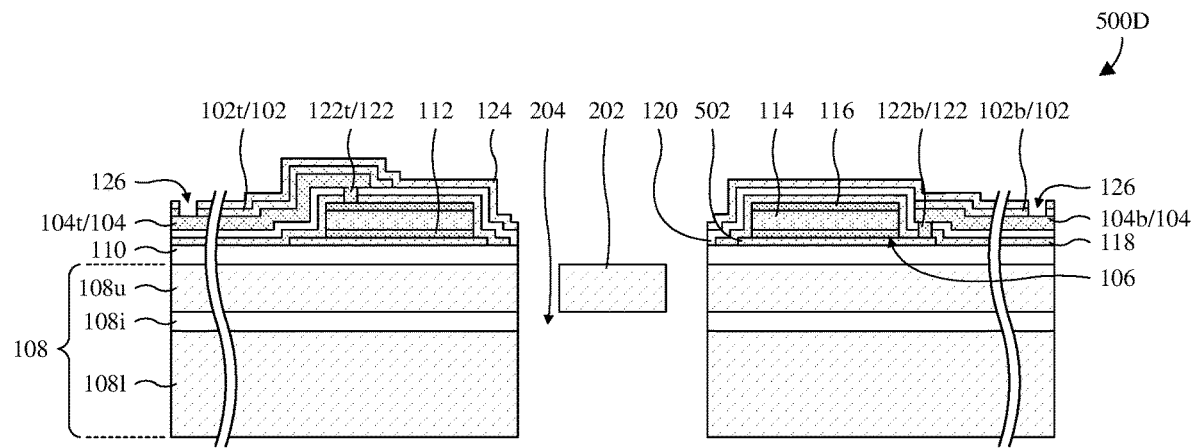

In FIG. 5D, the bottom and top electrodes 112, 116 and the piezoelectric layer 114 form common sidewalls and share a common width. Further, a getter layer 502 separates the piezoelectric device 106 from the substrate dielectric layer 110 and has a greater width than the common width. The getter layer 502 is configured to absorb hydrogen ions and/or other errant materials, whereby the getter layer 502 may prevent hydrogen ions and/or other errant materials from diffusing to and accumulating in the piezoelectric layer 114. As described above, hydrogen ions that accumulate in the piezoelectric layer 114 may induce delamination and breakdown of the piezoelectric layer 114, whereby the piezoelectric device 106 may fail. Accordingly, by absorbing hydrogen ions, the getter layer 502 may prevent device failure.

In some embodiments, the substrate dielectric layer 110 comprises hydrogen ions, which are absorbed by the getter layer 502 to prevent the hydrogen ions from diffusing to the piezoelectric layer 114. For example, the substrate dielectric layer 110 may comprise hydrogen ions in embodiments in which the substrate dielectric layer 110 is tetraethyl orthosilicate (TEOS) silicon oxide (e.g., TEOS-SiO$_2$), silane silicon oxide (e.g., SiH$_4$—SiO$_2$), some other suitable oxide or dielectric, or any combination of the foregoing. In some embodiments, the getter layer 502 is or comprises titanium, barium, cerium, lanthanum, aluminum, magnesium, thorium, or some other suitable conductive getter material for hydrogen ions and/or other errant materials.

Figure 5E:
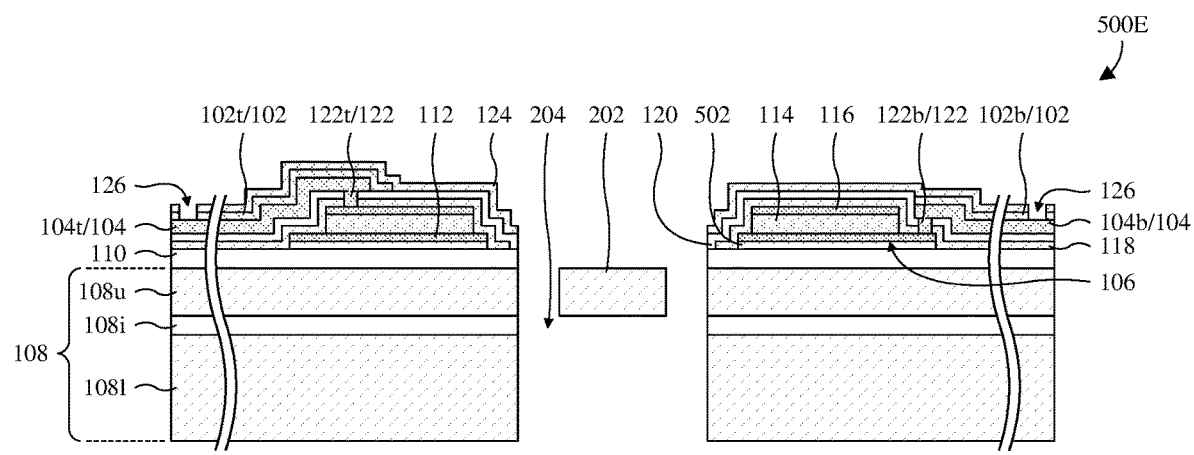

In FIG. 5E, the bottom electrode 112 and the getter layer 502 share a first common width and form first common sidewalls. Further, the piezoelectric layer 114 and the top electrode 116 share a second common width less than the first common width and form second common sidewalls laterally offset from the first common sidewalls.

Figure 5F:
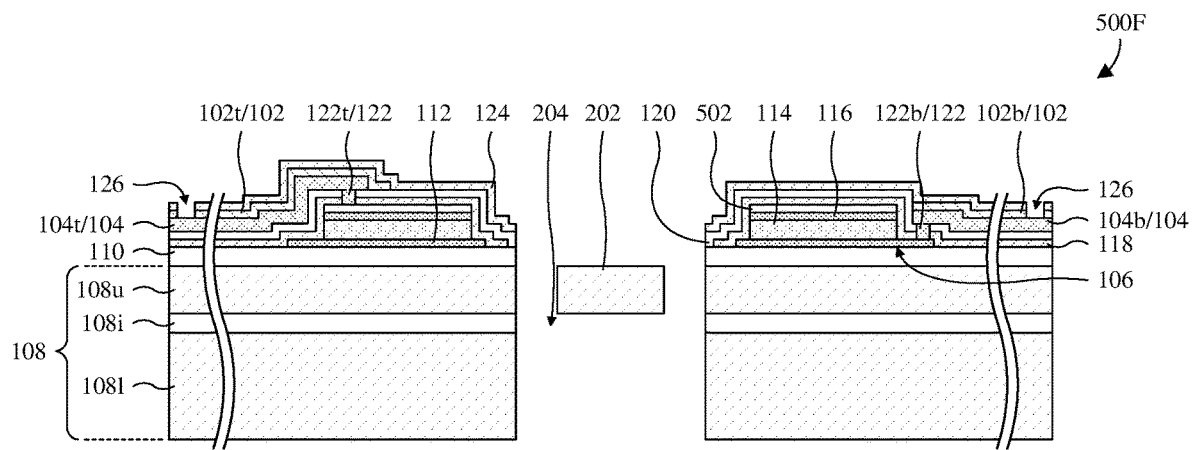

In FIG. 5F, the getter layer 502 described with regard to FIG. 5D separates the top electrode 116 from the device barrier layer 118 instead of separating the bottom electrode 112 from the substrate dielectric layer 110. Further, the getter layer 502 forms common sidewalls with the top electrode 116 and the piezoelectric layer 114 and shares a common width with the top electrode 116 and the piezoelectric layer 114.

Figure 5G:
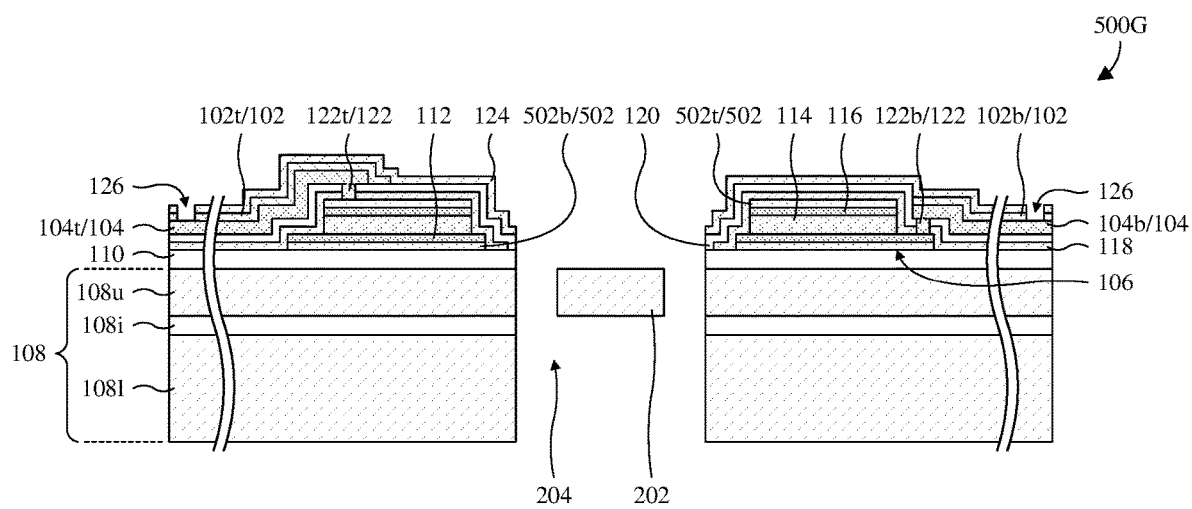

In FIG. 5G, a top-electrode getter layer 502t is atop the top electrode 116, whereas a bottom-electrode getter layer 502b is on an underside of the bottom electrode 112. The bottom-electrode getter layer 502b and the bottom-electrode getter layer 502b are respectively as their counterparts are described with regard to FIGS. 5E and 5F.

With reference to FIGS. 6, 7A, 7B, 8, 9A, 9B, 10, 11, 12A, 12B, 13, 14A, 14B, 15A, 15B, 16, 17A, 17B, 18, 19, 20A, and 20B, a series of views of some embodiments of a method for forming an IC chip in which a barrier layer caps a pad of a piezoelectric device is provided. Figures labeled with a suffix of "A" or with no suffix correspond to cross-sectional views, and figures labeled with a suffix of "B" correspond to top layout views for like numbered figured with a suffix of "A". The cross-sectional views of figures labeled with a suffix "A" may, for example, be taken along line A or B (whichever is present) in the top layout views of corresponding figures labeled with a suffix of "B". The method is illustrated forming an IC chip according to the embodiments of FIGS. 2 and 3. However, the method may alternatively be employed to form an IC chip according to other suitable embodiments.

Figure 6:
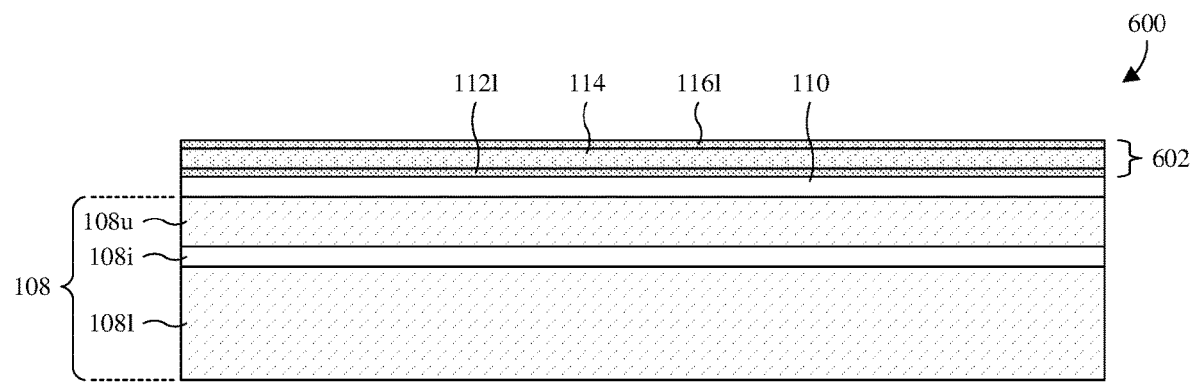
FIGS. 6, 7A, 7B, 8, 9A, 9B, 10, 11, 12A, 12B, 13, 14A, 14B, 15A, 15B, 16, 17A, 17B, 18, 19, 20A, and 20B illustrate a series of views of some embodiments of a method for forming an IC chip in which a barrier layer caps a pad of a piezoelectric device.

As illustrated by a cross-sectional view 600 of FIG. 6, a substrate dielectric layer 110 is deposited over a substrate 108. The substrate 108 is an SOI substrate and comprises a lower semiconductor layer 108l, an insulator layer 108i overlying the lower semiconductor layer 108l, and an upper semiconductor layer 108u overlying the insulator layer 108i. In alternative embodiments, the substrate 108 is a bulk semiconductor substrate or some other suitable type of semiconductor substrate. In some embodiments, the substrate dielectric layer 110 and the insulator layer 108i are a same material. In other embodiments, the substrate dielectric layer 110 and the insulator layer 108i are different materials.

Also illustrated by the cross-sectional view 600 of FIG. 6, a device film 602 is deposited over the substrate dielectric layer 110 and comprises a bottom-electrode layer 112l, a piezoelectric layer 114 overlying the bottom-electrode layer 1121, and a top-electrode layer 1161 overlying the piezoelectric layer 114. In some embodiments, the bottom-electrode layer 1121 and the top-electrode layer 1161 are a same material. In other embodiments, the bottom-electrode layer 1121 and the top-electrode layer 1161 are different materials.

Figure 7A:
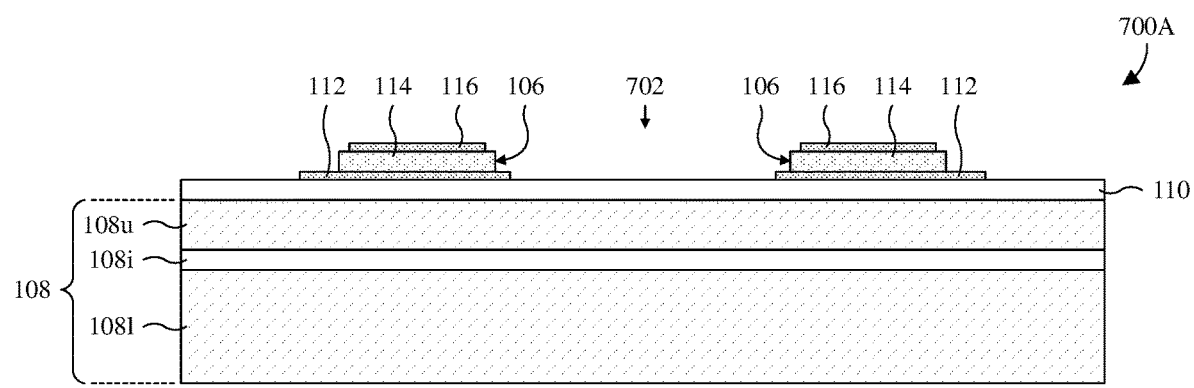
Figure 7B:
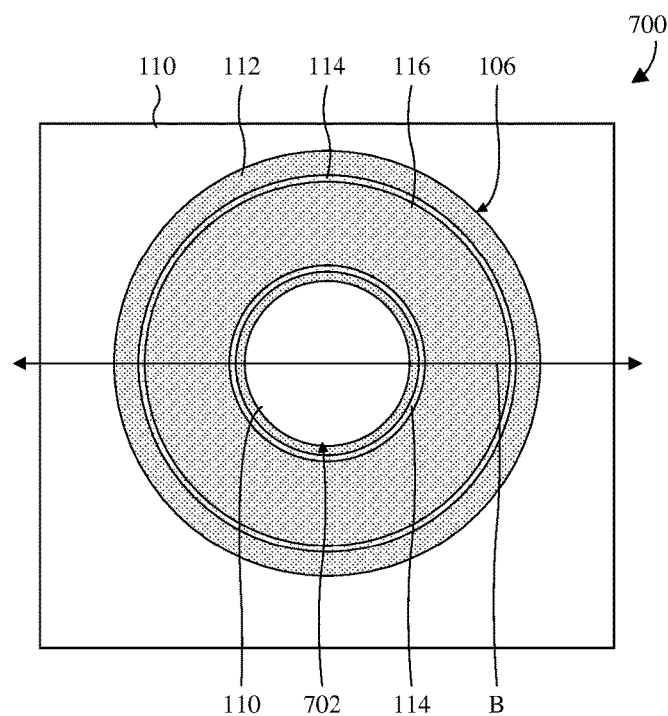

As illustrated by a cross-sectional view 700A of FIG. 7A, and a top layout view 700B of FIG. 7B, the device film 602 (see, e.g., FIG. 6) is patterned to form a piezoelectric device 106 having a ring-shaped top geometry (see, e.g., FIG. 7B) and extending in a closed path around a central area 702. In alternative embodiments, the piezoelectric device 106 may have some other suitable top geometry extending in a closed path around the central area 702. The piezoelectric device 106 comprises a bottom electrode 112, a patterned portion of the piezoelectric layer 114 (hereafter referred to more simply as the piezoelectric layer 114) overlying the bottom electrode 112, and a top electrode 116 overlying the piezoelectric layer 114.

The bottom electrode 112 corresponds to a patterned portion of the bottom-electrode layer 1121 (see, e.g., FIG. 6), whereas the top electrode 116 corresponds to a patterned portion of the top-electrode layer 1161. The piezoelectric layer 114 has a lesser width than the bottom electrode 112, and further has sidewalls laterally offset from sidewalls of the bottom electrode 112. The top electrode 116 has a lesser width than the piezoelectric layer 114, and further has sidewalls laterally offset from sidewalls of the piezoelectric layer 114.

In some embodiments, a process for performing the patterning does not employ hydrogen ions and/or other errant materials that may diffuse to and induce failure of the piezoelectric layer 114. Hydrogen ions that diffuse to the piezoelectric layer 114 may accumulate in the piezoelectric layer 114 and induce delamination and breakdown of the piezoelectric layer 114, whereby the piezoelectric device 106 may fail.

In some embodiments, a process for performing the patterning comprises: 1) performing a first photolithography/etching process into the top-electrode layer 1161 using a first mask to form the top electrode 116; 2) performing a second photolithography/etching process into the piezoelectric layer 114 using a second mask; and 3) performing a third photolithography/etching process into the bottom-electrode layer 1121 using a third mask to form the bottom electrode 112. In alternative embodiments, some other suitable process is performed for the patterning. For example, the top-electrode layer 1161 and the piezoelectric layer 114 may be patterned together using a common photolithography/etching process and a common mask, whereas the bottom-electrode layer 1121 may be patterned using a different photolithography/etching process and a different mask. As example, the top-electrode layer 1161, the piezoelectric layer 114, and the bottom-electrode layer 1121 may be patterned together using a common photolithography/etching process and a common mask. The two alternative examples use fewer masks and hence reduce manufacturing costs.

Figure 8:
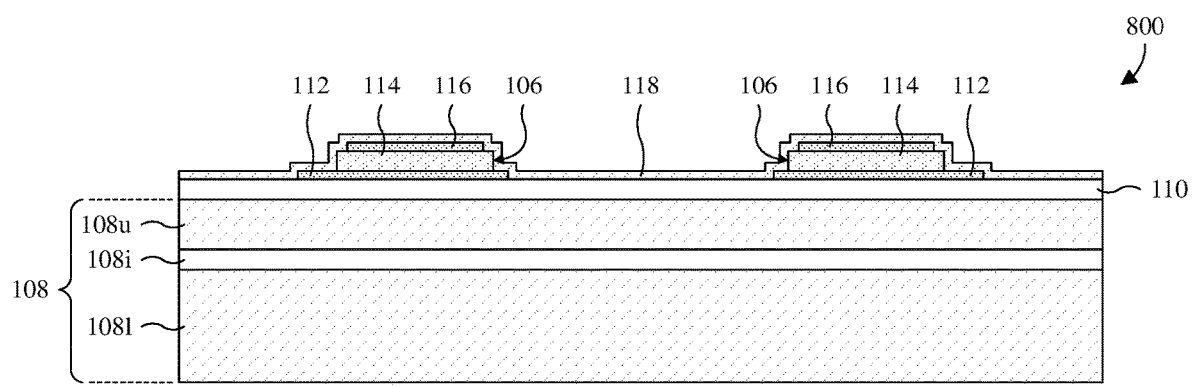

As illustrated by a cross-sectional view 800 of FIG. 8, a device barrier layer 118 is deposited covering the piezoelectric device 106 and the substrate dielectric layer 110. The device barrier layer 118 is configured to block hydrogen and/or other suitable errant materials from diffusing to the piezoelectric layer 114 from over the device barrier layer 118. By blocking diffusion of errant materials (e.g., hydrogen ions) to the piezoelectric layer 114, the pad barrier layer 102 may prevent failure of the piezoelectric device 106.

In some embodiments, the device barrier layer 118 is a metal oxide or some other suitable material. The metal oxide may, for example, be or comprise aluminum oxide (e.g., $Al_2O_3$), titanium oxide (e.g., $TiO_2$), iron oxide (e.g., $Fe_2O_3$), zirconium oxide (e.g., $ZrO_2$), zinc oxide (e.g., $ZnO$), copper oxide (e.g., $CuO$), tantalum oxide (e.g., $Ta_2O_5$), some other suitable type of metal oxide, or any combination of the foregoing.

The device barrier layer 118 is deposited by a process that does not expose the piezoelectric layer 114 to hydrogen ions and/or other suitable errant materials. For example, the device barrier layer 118 may be deposited by physical vapor deposition (PVD), atomic layer deposition (ALD), or some other suitable deposition process(es).

Figure 9A:
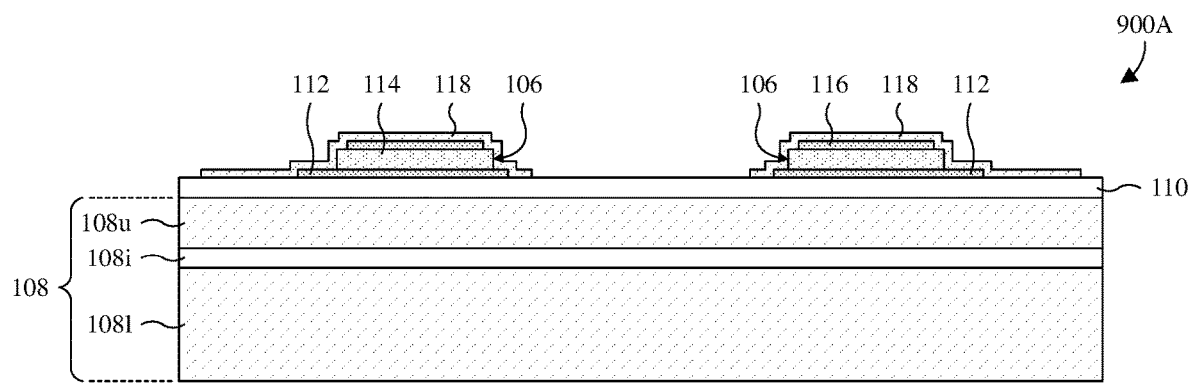
Figure 9B:
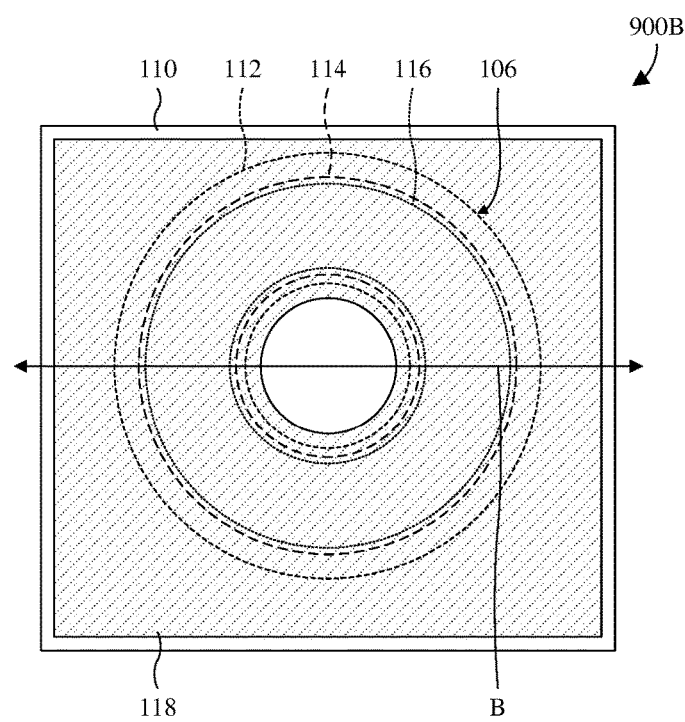

As illustrated by a cross-sectional view 900A of FIG. 9A, and a top layout view 900B of FIG. 9B, the device barrier layer 118 is patterned to remove a central portion of the device barrier layer 118 surrounded by the piezoelectric device 106. Further, the patterning removes a peripheral portion of the device barrier layer 118 surrounding the piezoelectric device 106. At completion of the patterning, the piezoelectric device 106 remains covered (e.g., completely covered) by the device barrier layer 118. The patterning may, for example, be performed by a photolithography/etching process or by some other suitable process.

Figure 10:
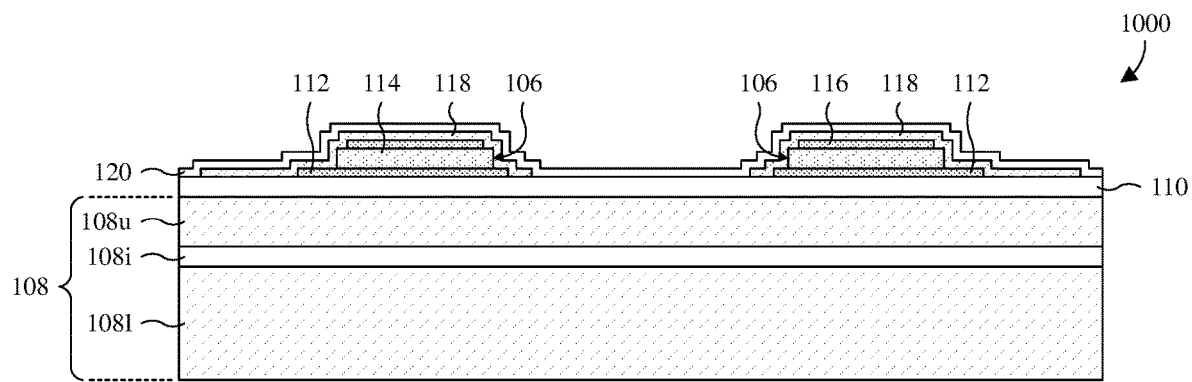

As illustrated by a cross-sectional view 1000 of FIG. 10, a device dielectric layer 120 is deposited covering the device barrier layer 118. The device dielectric layer 120 may, for example, be or comprise TEOS oxide and/or some other suitable dielectric(s). In some embodiments, the device dielectric layer 120 is deposited by a deposition process that exposes the device barrier layer 118 to hydrogen ions and/or other errant materials. In such embodiments, the device barrier layer 118 blocks the errant material (e.g., the hydrogen ions) from accumulating in the piezoelectric layer 114. As described above, this may, for example, prevent failure of the piezoelectric device 106.

Figure 11:
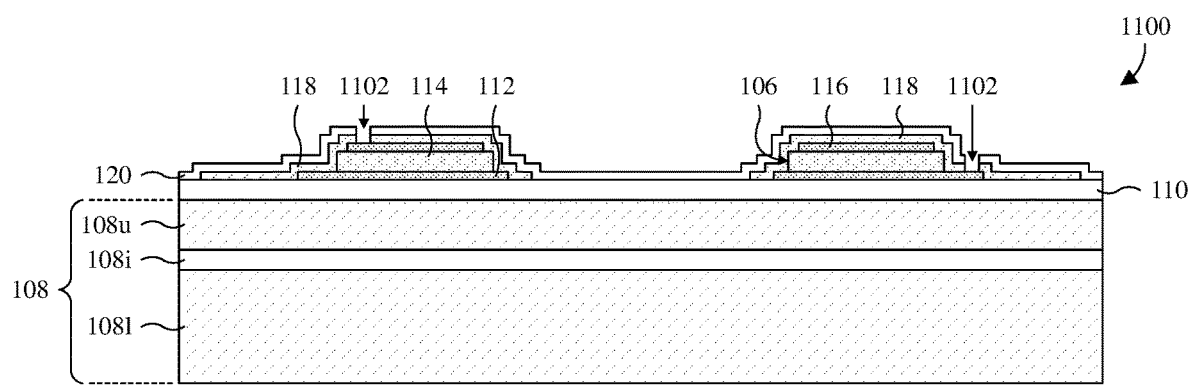

As illustrated by the cross-sectional view 1100 of FIG. 11, the device dielectric layer 120 and the device barrier layer 118 are patterned to form a pair of via openings 1102. The via openings 1102 are individual to and respectively expose the top electrode 116 and the bottom electrode 112. In some embodiments, the patterning is performed by a process that does employ hydrogen ions and/or other errant materials that may diffuse to and induce failure of the piezoelectric layer 114. In some embodiments, the patterning is performed by a photolithography/etching process or by some other suitable patterning process.

Figure 12A:
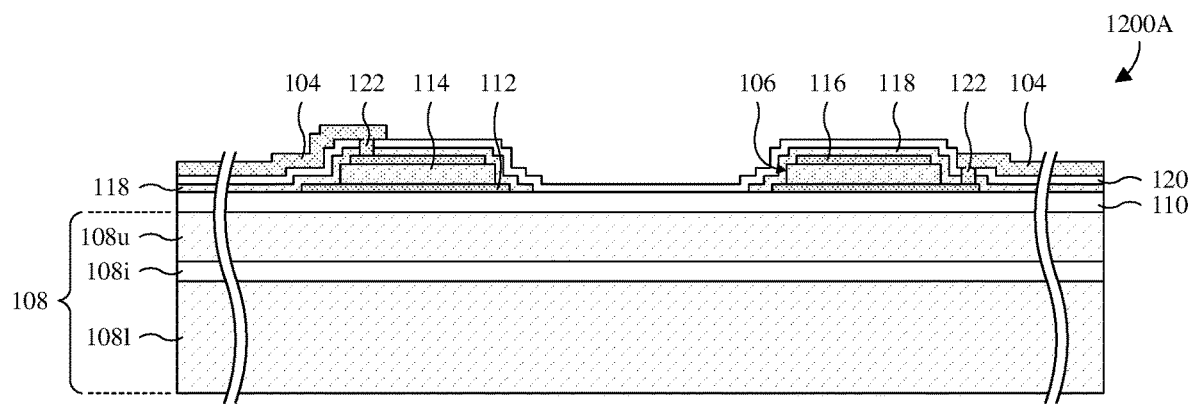
Figure 12B:
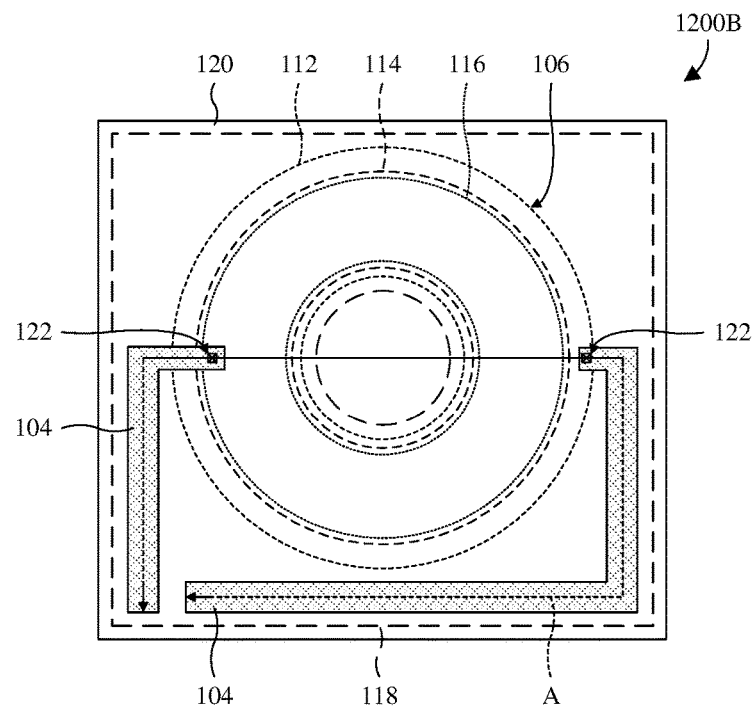

As illustrated by a cross-sectional view 1200A of FIG. 12A, and a top layout view 1200B of FIG. 12B, a pair of pads 104 and a pair of vias 122 are formed. The pads 104 have first ends individual to and respectively overlying the via openings 1102 (see, e.g., FIG. 11). Further, the pads 104 have second ends distal from the first ends and laterally offset from the first ends. The vias 122 are individual to and respectively fill the via openings 1102. Further, the vias 122 extend respectively from the pads 104 respectively to the top electrode 116 and the bottom electrode 112. In some embodiments, the pads 104 and the vias 122 are part of a common layer. In other embodiments, the pads 104 are part of a first layer, whereas the vias 122 are part of a second layer that is different than the first layer.

In some embodiments, the pads 104 and the vias 122 are formed by a process that does not employ hydrogen ions and/or other errant materials that may diffuse to and induce failure of the piezoelectric layer 114. In some embodiments, a process for forming the pads 104 and the vias 122 comprises: 1) depositing a conductive layer covering the device dielectric layer 120 and filling the via openings 1102; and 2) performing a photolithography/etching process to pattern the conductive layer into the pads 104. In alternative embodiments, some other suitable process is performed for forming the pads 104 and the vias 122.

Figure 13:
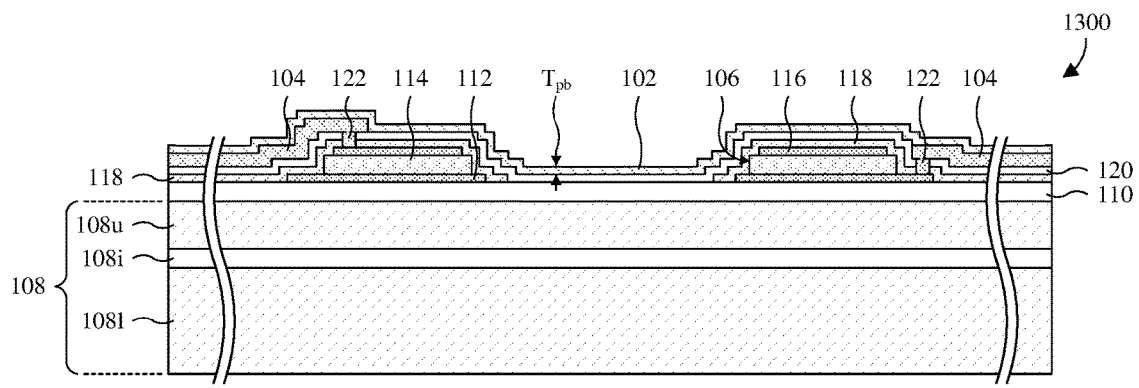

As illustrated by a cross-sectional view 1300 of FIG. 13, a pad barrier layer 102 is deposited covering the pads 104 and the device dielectric layer 120. The pad barrier layer 102 is configured to block hydrogen ions and/or other suitable errant materials from diffusing to the piezoelectric device 106 from over the pad 104.

Absent the pad barrier layer 102, hydrogen ions from hydrogen-containing semiconductor manufacturing processes performed after forming the pad 104 may diffuse to the piezoelectric layer 114 along the vias 122. As described above, hydrogen ions that diffuse to the piezoelectric layer 114 may accumulate in the piezoelectric layer 114 and induce delamination and breakdown of the piezoelectric layer 114, whereby the piezoelectric device 106 may fail. Therefore, by blocking diffusion of hydrogen ions to the piezoelectric layer 114, the device barrier layer 118 may prevent delamination and breakdown of the piezoelectric layer 114. This, in turn, may prevent failure of the piezoelectric device 106.

The pad barrier layer 102 is deposited by a process that does not expose the pads 104 to hydrogen ions and/or other suitable errant materials. For example, the pad barrier layer 102 may be deposited by PVD, ALD, or some other suitable deposition process(es).

In some embodiments, a thickness $T_{pb}$ of the pad barrier layer 102 is about 200-600 angstroms, about 200-400 angstroms, about 400-600 angstroms, or some other suitable value. If the thickness $T_{pb}$ is too small (e.g., less than about 200 angstroms), the pad barrier layer 102 may be unable to block diffusion of hydrogen ions and/or other errant materials through the pad barrier layer 102. If the thickness $T_{pb}$ is too large (e.g., more than about 600 angstroms), material may be wasted and high topographical variation at the pad barrier layer 102 may present processing challenges that reduce manufacturing yields.

In some embodiments, the pad barrier layer 102 is crystalline and/or has a density greater than about 2 g/cm$^3$, 2.6 g/cm$^3$, 5 g/cm$^3$, or some other suitable value. It has been appreciated that such a density may block diffusion of hydrogen ions and/or other errant materials through the pad barrier layer 102. In some embodiments, the pad barrier layer 102 is a metal oxide or some other suitable material. The metal oxide may, for example, be or comprise aluminum oxide (e.g., $Al_2O_3$), titanium oxide (e.g., $TiO_2$), iron oxide (e.g., $Fe_2O_3$), zirconium oxide (e.g., $ZrO_2$), zinc oxide (e.g., ZnO), copper oxide (e.g., CuO), tantalum oxide (e.g., $Ta_2O_5$), some other suitable type of metal oxide, or any combination of the foregoing.

In some embodiments, the pad barrier layer 102 is a same material as the device barrier layer 118. In other embodiments, the pad barrier layer 102 is a different material than the device barrier layer 118. In some embodiments, the device barrier layer 118 is crystalline and/or has a density greater than about 2 g/cm$^3$, 2.6 g/cm$^3$, 5 g/cm$^3$, or some other suitable value. In some embodiments, the density is the same as that of the pad barrier layer 102.

Figure 14A:
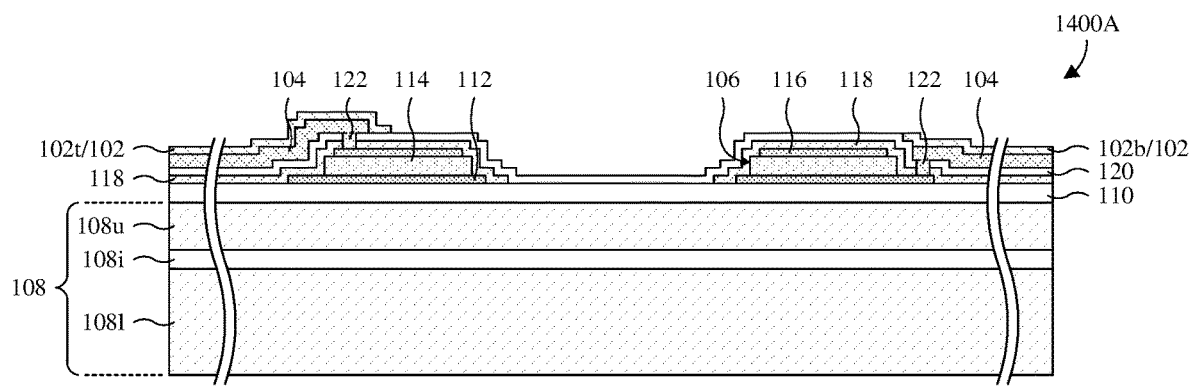
Figure 14B:
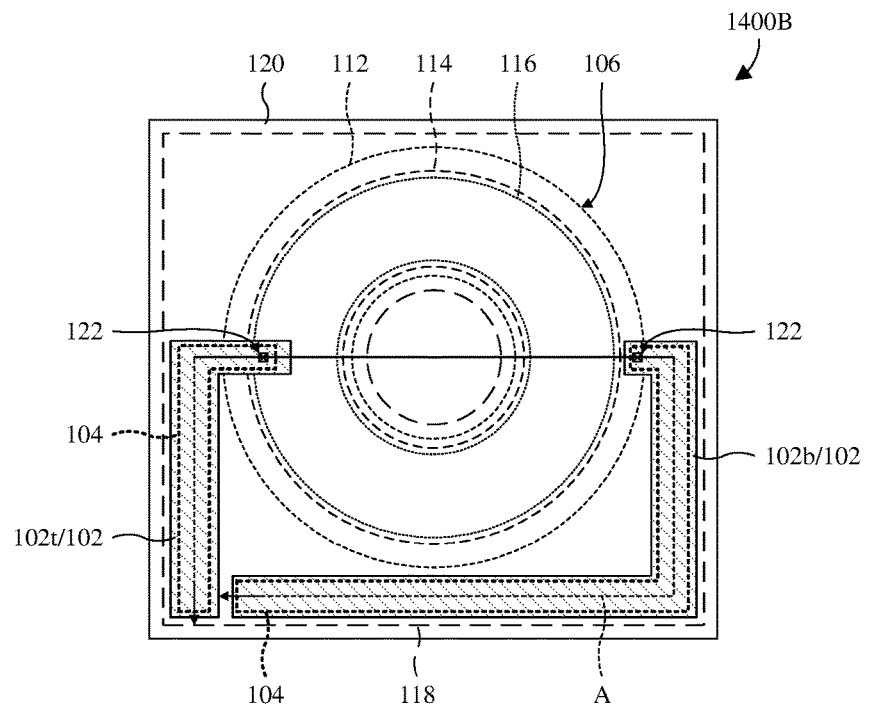

As illustrated by a cross-sectional view 1400A of FIG. 14A, and a top layout view 1400B of FIG. 14B, the pad barrier layer 102 is patterned to segment the pad barrier layer 102. A bottom-electrode barrier segment 102b overlies and is localized to the pad 104 at the bottom electrode 112, and a top-electrode barrier segment 102t overlies and is localized to the pad 104 at the top electrode 116. At completion of the patterning, the pads 104 remain covered (e.g., completely covered) by the pad barrier layer 102. The patterning may, for example, be performed by a photolithography/etching process or by some other suitable process.

Figure 15A:
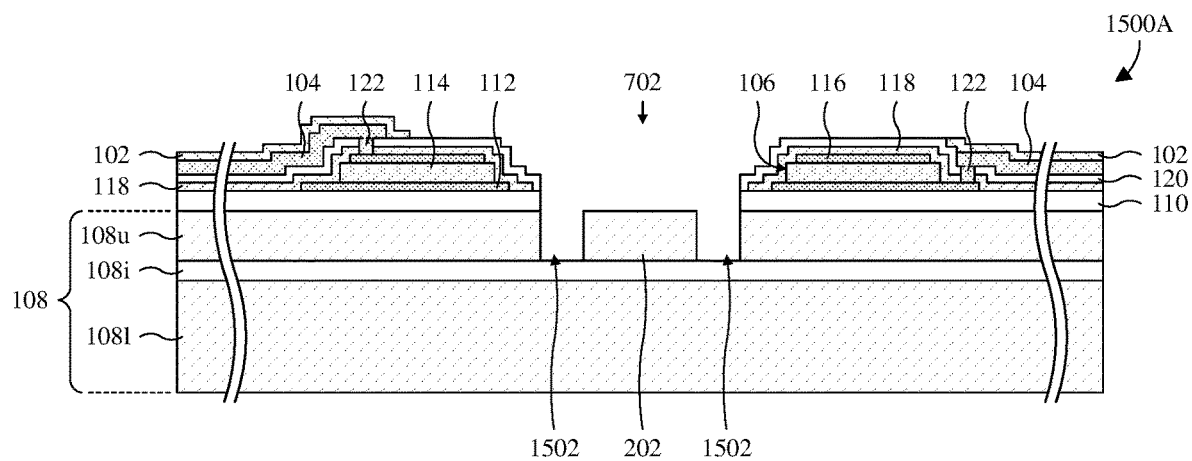
Figure 15B:
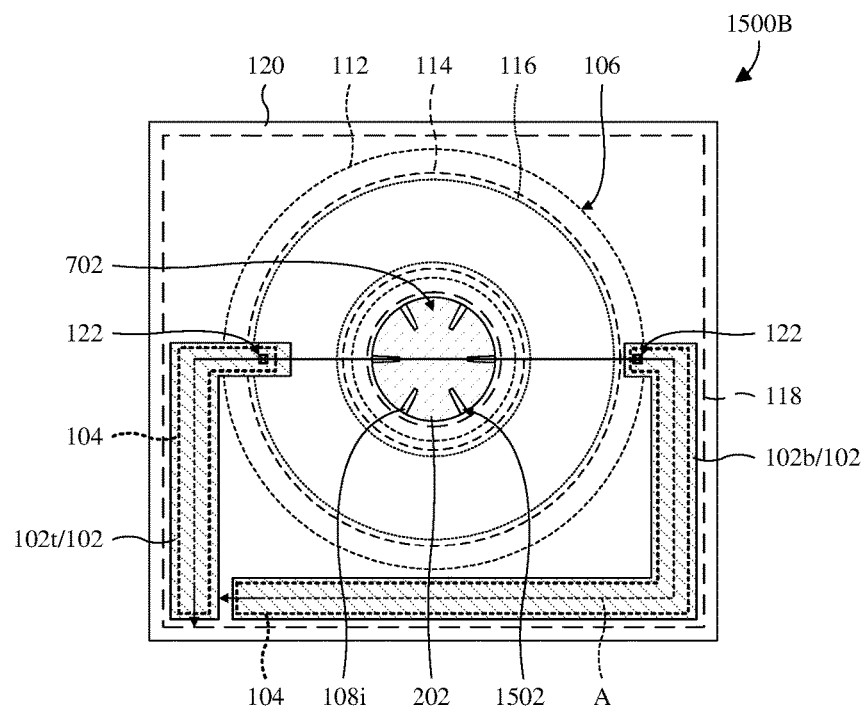

As illustrated by a cross-sectional view 1500A of FIG. 15A, and a top layout view 1500B of FIG. 15B, the device and substrate dielectric layers 120, 110 and the upper semiconductor layer 108u are patterned to form a plurality of slits 1502 at the central area 702 surrounded by the piezoelectric device 106. The slits 1502 overlie the insulator layer 108i, and extend through the device and substrate dielectric layers 120, 110 and the upper semiconductor layer 108u to the insulator layer 108i. Further, the slits 1502 are circumferentially spaced around, and extend laterally into, a circular region of the upper semiconductor layer 108u. The circular region is surrounded by the piezoelectric device (e.g., when viewed top down) and is hereafter referred to as a membrane 202.

In some embodiments, a process for forming the slits 1502 comprises: 1) forming a photoresist mask over the pad barrier layer 102 and the device dielectric layer 120; 2) performing a dry etch into the device and substrate dielectric layers 120, 110 and the upper semiconductor layer 108u with the mask in place; and 3) performing plasma ashing to remove the photoresist mask. In alternative embodiments, some other suitable process is performed to form the slits 1502. In some embodiments, the dry etching and/or the plasma ashing expose the expose the IC chip being formed to hydrogen ions and/or other errant materials. In such embodiments, the pad barrier layer 102 and the device barrier layer 118 block the errant material (e.g., the hydrogen ions) from diffusing to and accumulating in the piezoelectric layer 114. As described above, this may, for example, prevent failure of the piezoelectric device 106.

Figure 16:
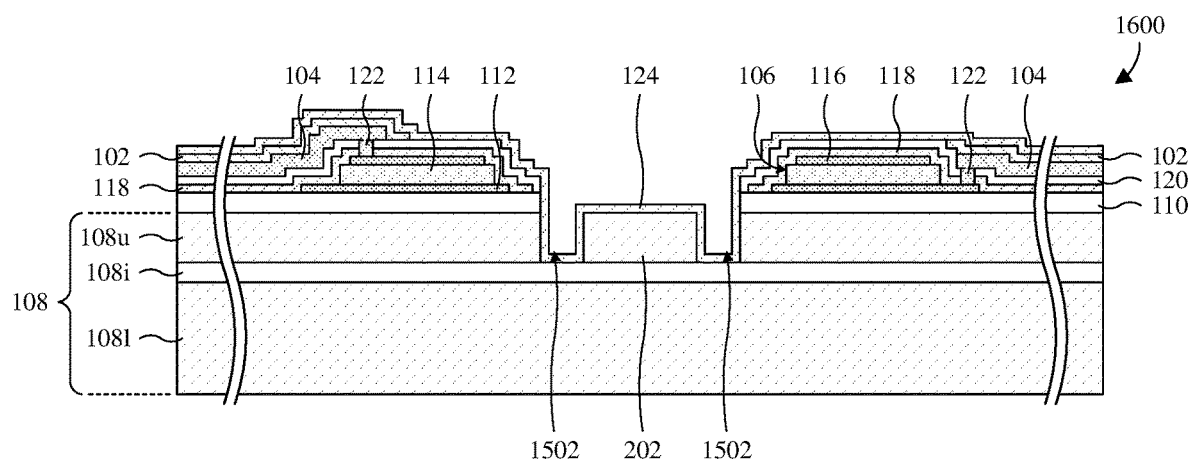

As illustrated by a cross-sectional view 1600 of FIG. 16, a passivation layer 124 is deposited covering the pad barrier layer 102, the device dielectric layer 120, and the membrane 202, and further lining the slits 1502. In some embodiments, the depositing exposes the IC chip being formed to hydrogen ions and/or other errant materials. In such embodiments, the pad barrier layer 102 and the device barrier layer 118 block the errant material (e.g., the hydrogen ions) from diffusing to and accumulating in the piezoelectric layer 114.

Figure 17A:
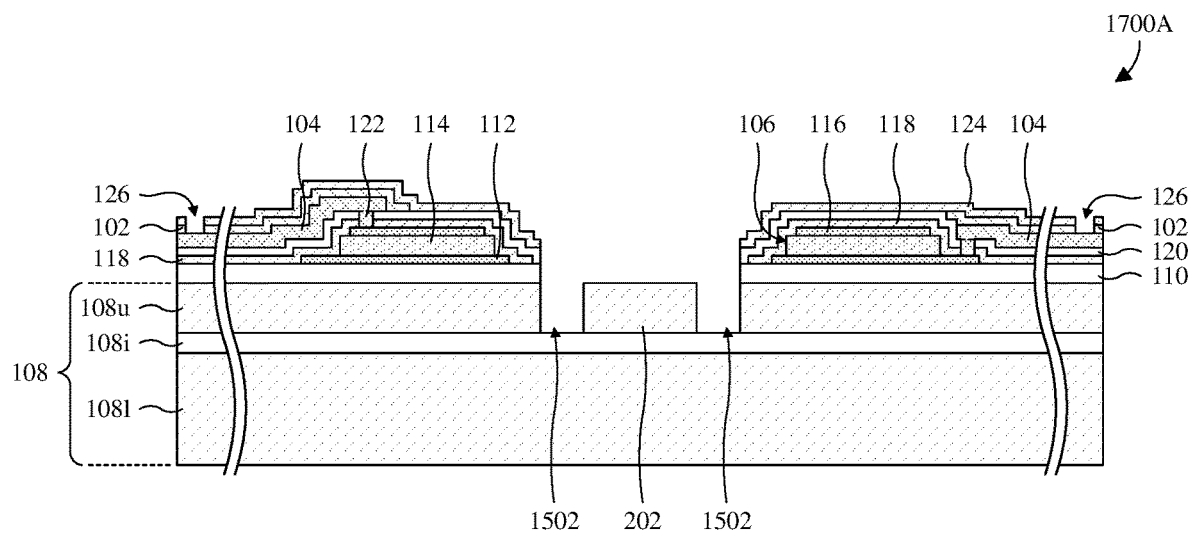
Figure 17B:
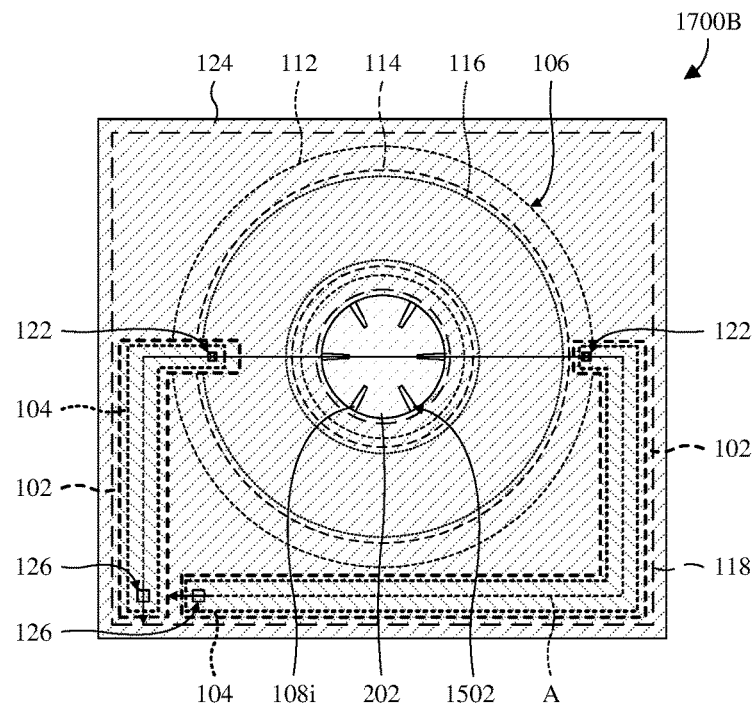

As illustrated by a cross-sectional view 1700A of FIG. 17A, and a top layout view 1700B of FIG. 17B, the passivation layer 124 and the pad barrier layer 102 are patterned to form pad openings 126 at ends of the pads 104 distal from the vias 122. Further, the patterning clears the passivation layer 124 from the membrane 202 and the slits 1502. In alternative embodiments, the passivation layer 124 persists at the membrane 202 and the slits 1502 (e.g., to form the IC chip according to the embodiments of FIG. 5A).

In some embodiments, a process for performing the patterning comprises: 1) forming a photoresist mask over the passivation layer 124; 2) performing a dry etch into the passivation layer 124 and the pad barrier layer 102 with the mask in place; and 3) performing plasma ashing to remove the photoresist mask. In alternative embodiments, some other suitable process is performed to form the pad openings 126.

In some embodiments, the dry etching and/or the plasma ashing expose the IC chip being formed to hydrogen ions and/or other errant materials. Because the pad openings 126 extend through the pad barrier layer 102, hydrogen ions and/or other errant materials may extend through the pad barrier layer 102. However, because the pad openings 126 are at ends of the pads 104 distal from the vias 122, the diffusion path from the pad openings 126 to the piezoelectric layer 114 may be long. Hence, the likelihood of hydrogen ions and/or other errant materials diffusing to the piezoelectric layer 114 is low.

Figure 18:
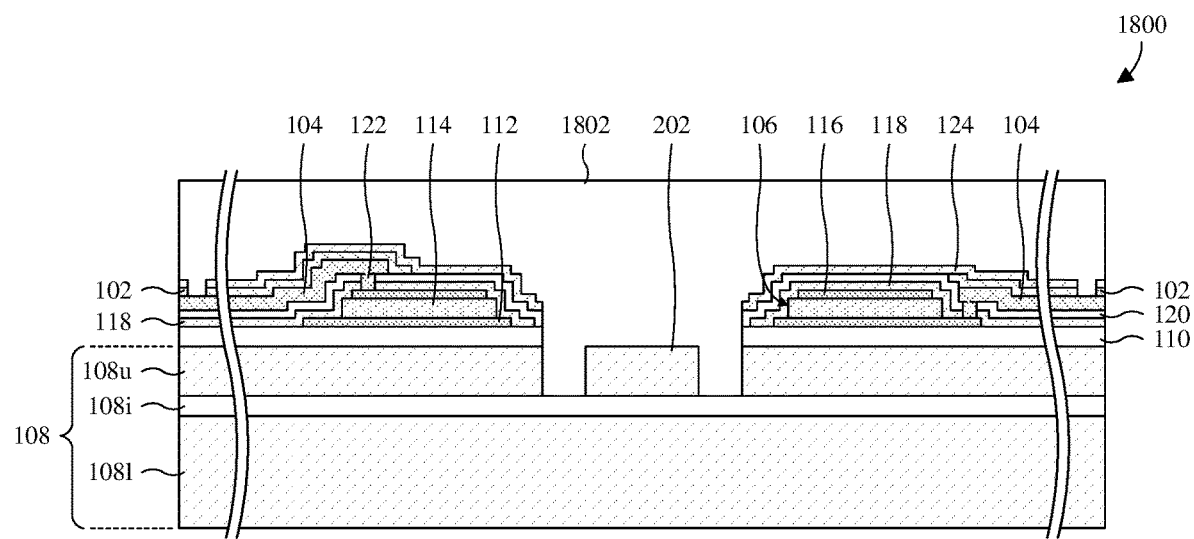

As illustrated by a cross-sectional view 1800 of FIG. 18, a sacrificial layer 1802 is deposited covering the IC chip being formed and filling the pad openings 126 (see, e.g., FIGS. 17A and 17B) and the slits 1502 (see, e.g., FIGS. 17A and 17B). In some embodiments, the sacrificial layer 1802 is silicon oxide and/or some other suitable dielectric(s).

Figure 19:
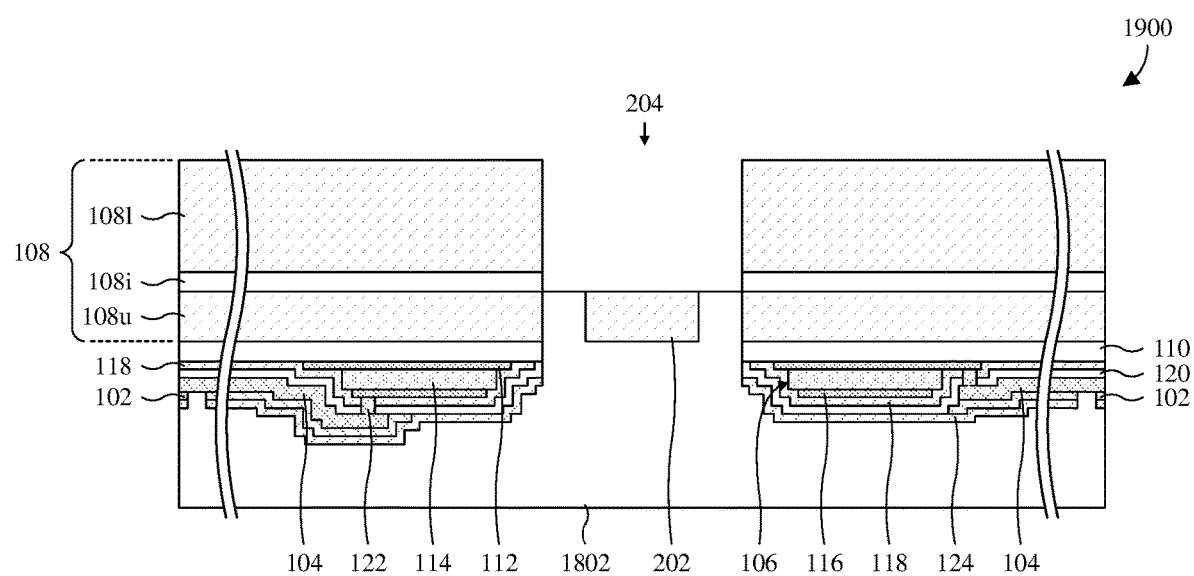

As illustrated by a cross-sectional view 1900 of FIG. 19, the IC chip of FIG. 18 is flipped vertically and the substrate 108 is patterned to form a sound opening 204 overlying and exposing the membrane 202. The patterning may, for example, be performed by a photolithography/etching process or by some other suitable process.

Figure 20A:
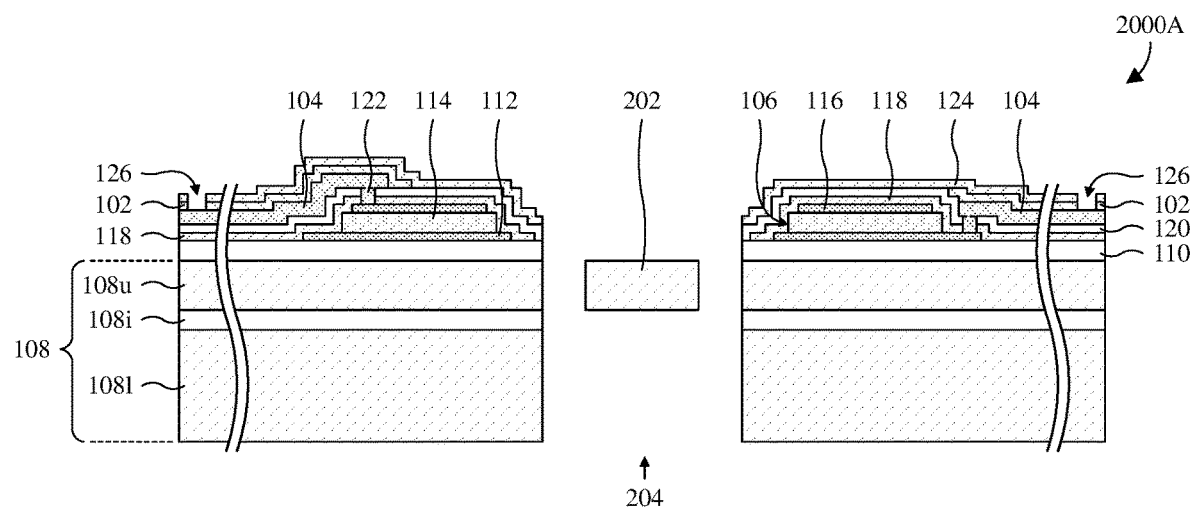
Figure 20B:
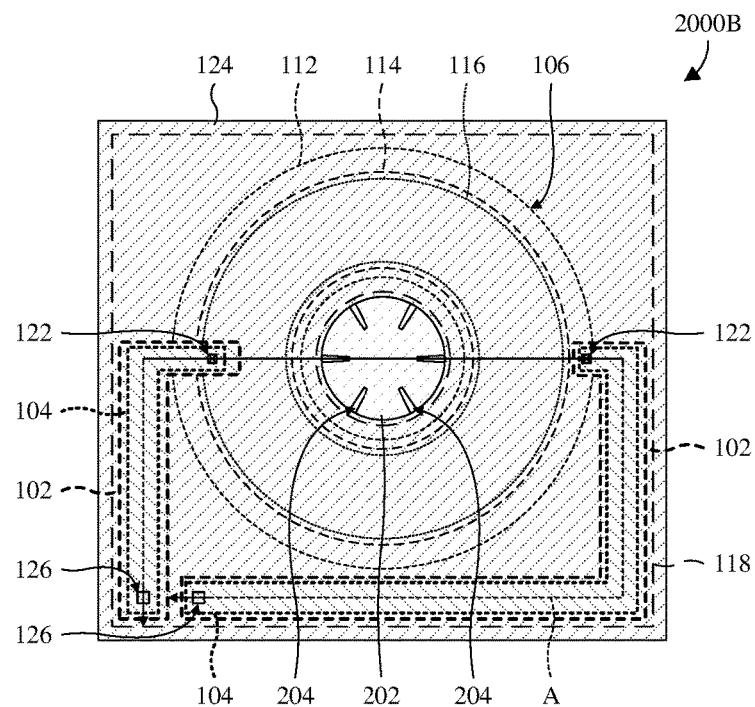

As illustrated by a cross-sectional view 2000A of FIG. 20A, and a top layout view 2000B of FIG. 20B, the IC chip is flipped vertically. Further, the sacrificial layer 1802 is removed. The removal may, for example, be performed by an etch using an etchant having a high selectivity for the sacrificial layer 1802 relative to underlying structure (e.g., the passivation layer 124 and the membrane 202).

By removing the sacrificial layer 1802, the sound opening 204 incorporates the slits 1502 (see, e.g., FIGS. 17A and 17B) and hence extends through the membrane 202. Further, the membrane 202 is released and may move in the sound opening 204. In response to application of a voltage across the piezoelectric layer 114, from the top electrode 116 to the bottom electrode 112, the piezoelectric device 106 may vibrate. The vibrations may move to the membrane 202 and cause the membrane 202 to vibrate, which generates sound waves in the sound opening 204. Accordingly, the piezoelectric device 106 and the membrane 202 coordinate to form a piezoelectric speaker.

While FIGS. 6, 7A, 7B, 8, 9A, 9B, 10, 11, 12A, 12B, 13, 14A, 14B, 15A, 15B, 16, 17A, 17B, 18, 19, 20A, and 20B are described with reference to a method, it will be appreciated that the structures shown in these figures are not limited to the method but rather may stand alone separate of the method. While FIGS. 6, 7A, 7B, 8, 9A, 9B, 10, 11, 12A, 12B, 13, 14A, 14B, 15A, 15B, 16, 17A, 17B, 18, 19, 20A, and 20B are described as a series of acts, it will be appreciated that the order of the acts may be altered in other embodiments. While FIGS. 6, 7A, 7B, 8, 9A, 9B, 10, 11, 12A, 12B, 13, 14A, 14B, 15A, 15B, 16, 17A, 17B, 18, 19, 20A, and 20B illustrate and describe as a specific set of acts, some acts that are illustrated and/or described may be omitted in other embodiments. Further, acts that are not illustrated and/or described may be included in other embodiments.

Figure 21:
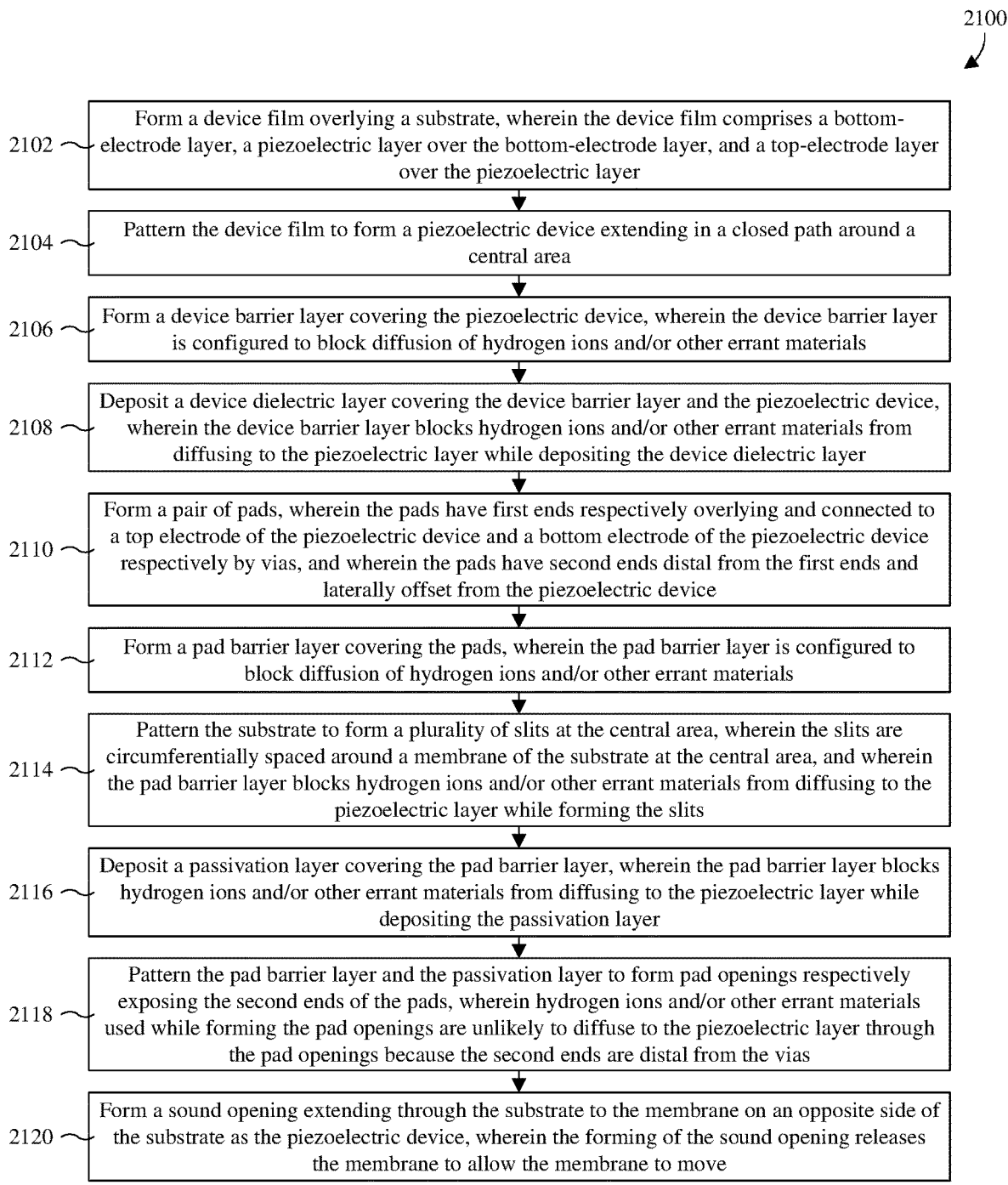
FIG. 21 illustrates a block diagram of some embodiments of the method of FIGS. 6, 7A, 7B, 8, 9A, 9B, 10, 11, 12A, 12B, 13, 14A, 14B, 15A, 15B, 16, 17A, 17B, 18, 19, 20A, and 20B.

With reference to FIG. 21, a block diagram 2100 of some embodiments of the method of FIGS. 6, 7A, 7B, 8, 9A, 9B, 10, 11, 12A, 12B, 13, 14A, 14B, 15A, 15B, 16, 17A, 17B, 18, 19, 20A, and 20B is provided.

At 2102, a device film is formed overlying a substrate, wherein the device film comprises a bottom-electrode layer, a piezoelectric layer over the bottom-electrode layer, and a top-electrode layer over the piezoelectric layer. See, for example, FIG. 6.

At 2104, the device film is patterned to form a piezoelectric device extending in a closed path around a central area. See, for example, FIGS. 7A and 7B.

At 2106, a device barrier layer is formed covering the piezoelectric device, wherein the device barrier layer is configured to block diffusion of hydrogen ions and/or other errant materials. See, for example, FIGS. 8, 9A, and 9B.

At 2108, a device dielectric layer is deposited covering the device barrier layer and the piezoelectric device, wherein the device dielectric layer blocks hydrogen ions and/or other errant materials from diffusing to the piezoelectric layer while depositing the device dielectric layer. See, for example, FIG. 10.

At 2110, a pair of pads is formed, wherein the pads have first ends respectively overlying and connected to a top electrode of the piezoelectric device and a bottom electrode of the piezoelectric device respectively by vias, and wherein the pads have second ends distal from the first ends and laterally offset from the piezoelectric device. See, for example, FIGS. 11, 12A, and 12B.

At 2112, a pad barrier layer is formed covering the pads, wherein the pad barrier layer is configured to block diffusion of hydrogen ions and/or other errant materials. See, for example, FIGS. 13, 14A, and 14B.

At 2114, the substrate is patterned to form a plurality of slits at the central area, wherein the slits are circumferentially spaced around a membrane of the substrate at the central area, and wherein the pad barrier layer blocks hydrogen ions and/or other errant materials from diffusing to the piezoelectric layer while forming the slits. See, for example, FIGS. 15A and 15B.

At 2116, a passivation layer is deposited covering the pad barrier layer, wherein the pad barrier layer blocks hydrogen ions and/or other errant materials from diffusing to the piezoelectric layer while depositing the passivation layer. See, for example, FIG. 16.

At 2118, the pad barrier layer and the passivation layer are patterned to form pad openings respectively exposing the second ends of the pads, wherein hydrogen ions and/or other errant materials used while forming the pad openings are unlikely to diffuse to the piezoelectric layer through the pad openings because the second ends are distal from the vias. See, for example, FIGS. 17A and 17B.

At 2120, a sound opening is formed extending through the substrate to the membrane on an opposite side of the substrate as the piezoelectric device, wherein the forming of the sound opening releases the membrane to allow the membrane to move. See, for example, FIGS. 18, 19, 20A, and 20B.

While the block diagram 2100 of FIG. 21 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

Figure 22:
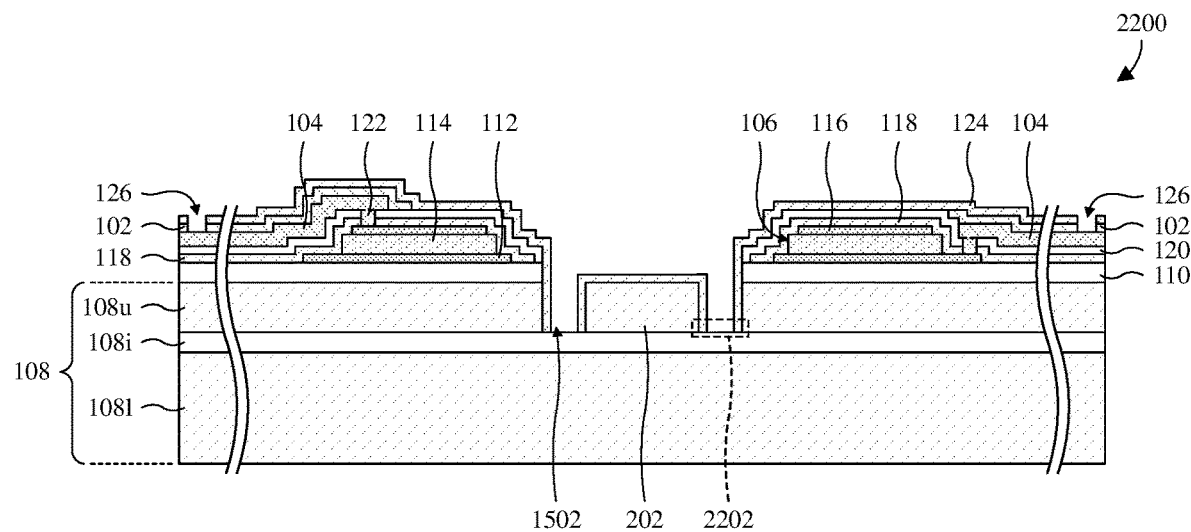
FIG. 22 illustrates a cross-sectional view of some first alternative embodiments of the method of FIGS. 6, 7A, 7B, 8, 9A, 9B, 10, 11, 12A, 12B, 13, 14A, 14B, 15A, 15B, 16, 17A, 17B, 18, 19, 20A, and 20B.

With reference to FIG. 22, a cross-sectional view 2200 of some first alternative embodiments of the method of FIGS. 6, 7A, 7B, 8, 9A, 9B, 10, 11, 12A, 12B, 13, 14A, 14B, 15A, 15B, 16, 17A, 17B, 18, 19, 20A, and 20B is provided in which the passivation layer 124 persists on the membrane 202 at completion of the method.

As illustrated by the cross-sectional view 2200 of FIG. 22, the acts described with regard to FIGS. 6, 7A, 7B, 8, 9A, 9B, 10, 11, 12A, 12B, 13, 14A, 14B, 15A, 15B, and 16 are performed. Thereafter, the patterning described with regard to FIGS. 17A and 17B is performed, except that the patterning does not clear the passivation layer 124 from the membrane 202 and the slits 1502. Rather, the patterning forms openings 2202 extending through the passivation layer 124 respectively at the slits 1502 to expose the insulator layer 108i. Thereafter, the acts described with regard to FIGS. 18, 19, 20A, and 20B are performed. The resulting IC chip may, for example, be as illustrated at FIG. 5A.

Figure 23:
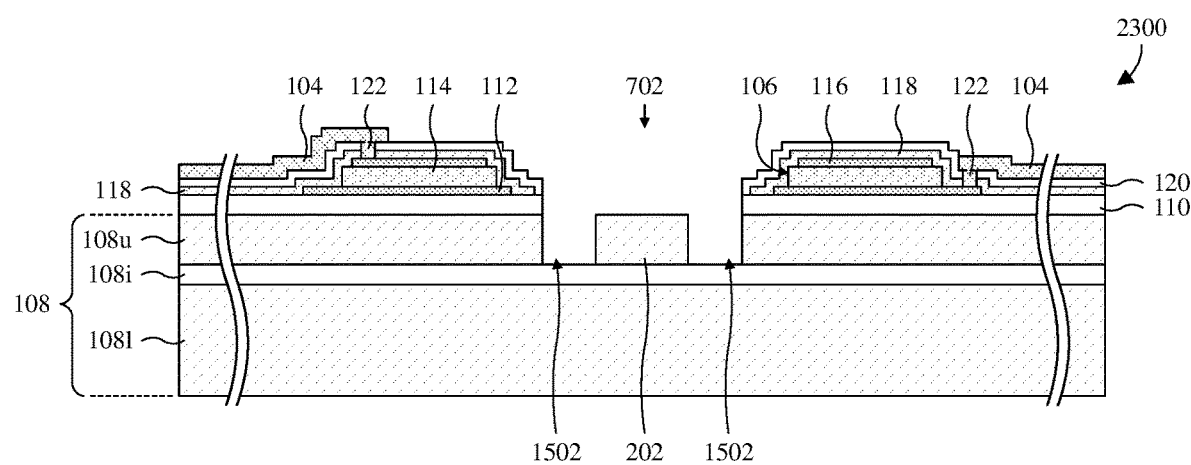
FIGS. 23-25 illustrate a series of cross-sectional views of some second alternative embodiments of the method of FIGS. 6, 7A, 7B, 8, 9A, 9B, 10, 11, 12A, 12B, 13, 14A, 14B, 15A, 15B, 16, 17A, 17B, 18, 19, 20A, and 20B.
Figure 24:
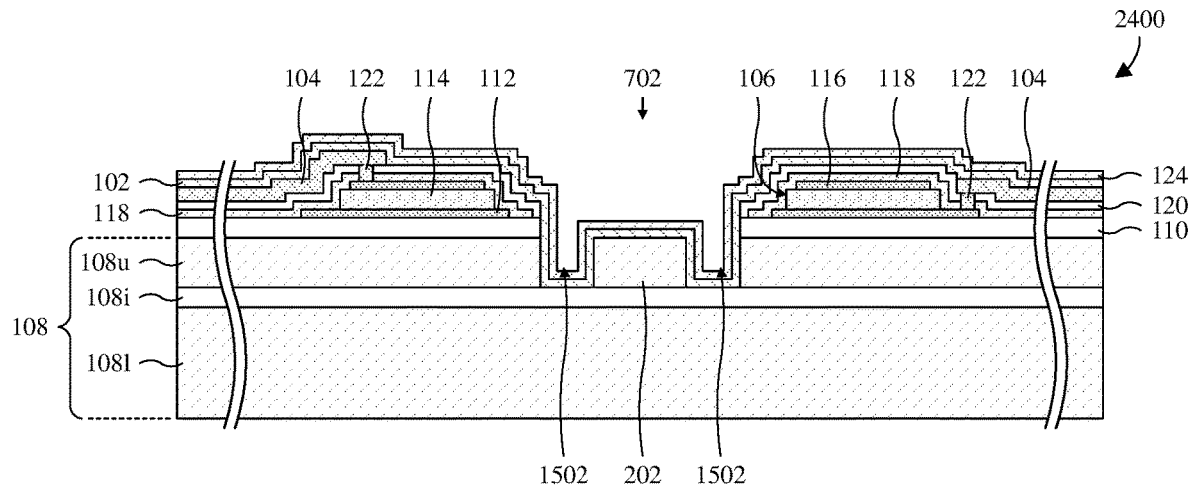
Figure 25:
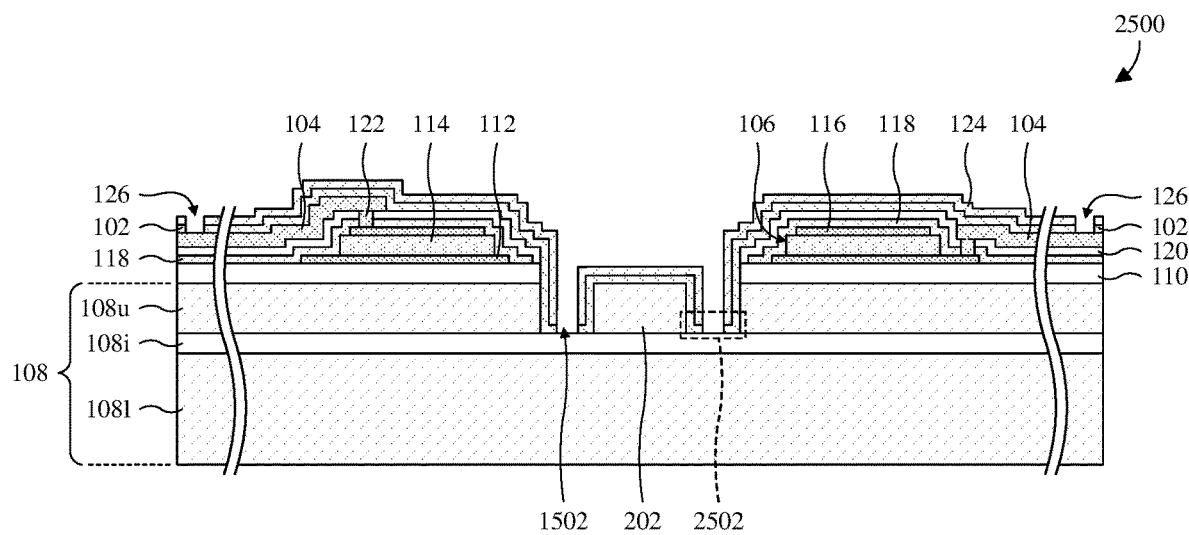

With reference to FIGS. 23-25, a series of cross-sectional views 2300-2500 of some second alternative embodiments of the method of FIGS. 6, 7A, 7B, 8, 9A, 9B, 10, 11, 12A, 12B, 13, 14A, 14B, 15A, 15B, 16, 17A, 17B, 18, 19, 20A, and 20B is provided in which the pad barrier layer 102 and the passivation layer 124 are on the membrane 202 at completion of the method.

As illustrated by the cross-sectional view 2300 of FIG. 23, the acts described with regard to FIGS. 6, 7A, 7B, 8, 9A, 9B, 10, 11, 12A, and 12B are performed. Further, the acts described with regard to FIGS. 15A and 15B are thereafter performed. Notably, the acts described with regard to FIGS. 13, 14A, and 14B are not performed. Hence, the pad barrier layer 102 is not formed before the patterning to form the slits 1502.

As illustrated by the cross-sectional view 2400 of FIG. 24, the acts described with regard to FIGS. 13 and 16 are sequentially formed to respectively deposit the pad barrier layer 102 and the passivation layer 124. Hence, the pad barrier layer 102 and the passivation layer 124 are deposited after the patterning to form the slits 1502.

As illustrated by the cross-sectional view 2500 of FIG. 25, the patterning described with regard to FIGS. 17A and 17B is performed, except that the patterning does not clear the pad barrier layer 102 and the passivation layer 124 from the membrane 202 and the slits 1502. Rather, the patterning forms openings 2502 extending through the passivation layer 124 and the pad barrier layer 102 respectively at the slits 1502 to expose the insulator layer 108i. Thereafter, the acts described with regard to FIGS. 18, 19, 20A, and 20B are performed. The resulting IC chip may, for example, be as illustrated at FIG. 5B.

Figure 26:
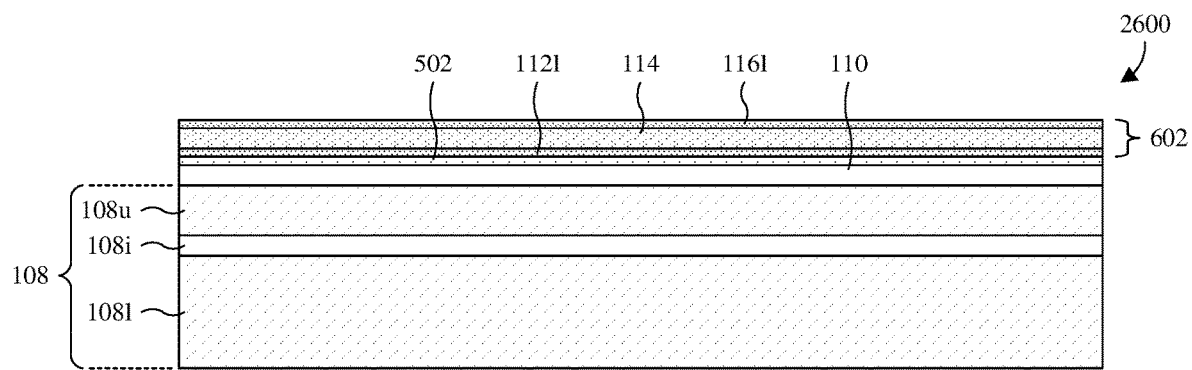
FIGS. 26 and 27 illustrate a series of cross-sectional views of some third alternative embodiments of the method of FIGS. 6, 7A, 7B, 8, 9A, 9B, 10, 11, 12A, 12B, 13, 14A, 14B, 15A, 15B, 16, 17A, 17B, 18, 19, 20A, and 20B.
Figure 27:
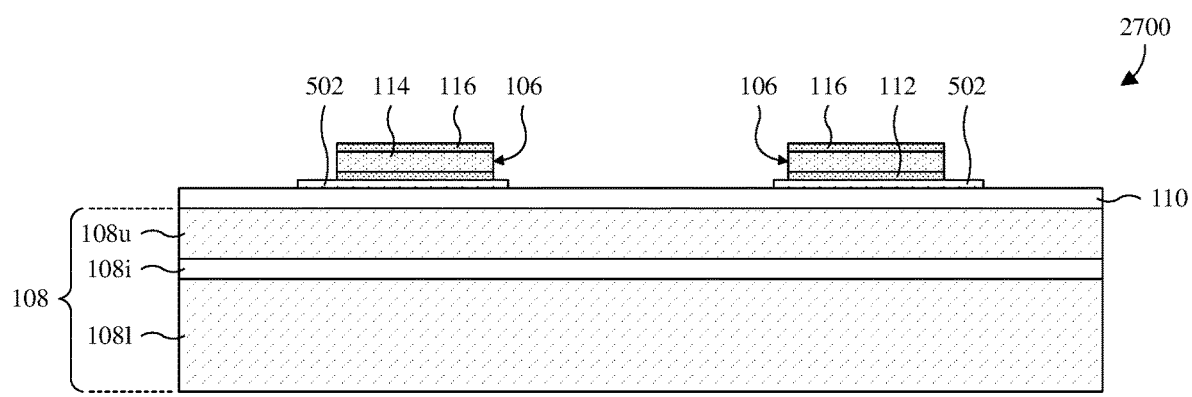

With reference to FIGS. 26 and 27, a series of cross-sectional views 2600 and 2700 of some third alternative embodiments of the method of FIGS. 6, 7A, 7B, 8, 9A, 9B, 10, 11, 12A, 12B, 13, 14A, 14B, 15A, 15B, 16, 17A, 17B, 18, 19, 20A, and 20B is provided in which a getter layer 502 is on a bottom of the bottom electrode 112.

As illustrated by the cross-sectional view 2600 of FIG. 26, the acts described with regard to FIG. 6 are performed, except that a getter layer 502 is deposited between the depositing of the substrate dielectric layer 110 and the depositing of the device film 602. The getter layer 502 is configured to absorb hydrogen ions and/or other errant materials, whereby the getter layer 502 may prevent hydrogen ions and/or other errant materials from accumulating in the piezoelectric layer 114. Further, the getter layer 502 is conductive and may, for example, be or comprise titanium, barium, cerium, lanthanum, aluminum, magnesium, thorium, or some other suitable conductive getter material for hydrogen ions and/or other errant materials.

As illustrated by the cross-sectional view 2700 of FIG. 27, the acts described with regard to FIGS. 7A and 7B are performed, with a few exceptions. The bottom-electrode layer 1121 (see, e.g., FIG. 26), the piezoelectric layer 114, and the top-electrode layer 1161 (see, e.g., FIG. 26) are patterned with a common pattern. Further, the getter layer 502 is patterned with a pattern different than the common pattern. In some embodiments, the common pattern is the same as that illustrated for the piezoelectric layer 114 in FIGS. 7A and 7B and/or the different pattern is the same as that illustrated for the bottom-electrode layer 1121 in FIGS. 7A and 7B. Thereafter, the acts described with regard to FIGS. 8, 9A, 9B, 10, 11, 12A, 12B, 13, 14A, 14B, 15A, 15B, 16, 17A, 17B, 18, 19, 20A, and 20B are performed. The resulting IC chip may, for example, be as illustrated at FIG. 5D.

In some embodiments, the present disclosure provides an IC chip including: a substrate; a piezoelectric device overlying the substrate; a pad overlying the piezoelectric device; a via extending from the pad to the piezoelectric device; and a barrier layer overlying the pad; wherein the barrier layer is configured to block hydrogen ions from diffusing through the barrier layer, from over the barrier layer to the piezoelectric device. In some embodiments, the barrier layer includes aluminum oxide, titanium oxide, iron oxide, zirconium oxide, zinc oxide, copper oxide, or tantalum oxide. In some embodiments, the barrier layer has a density in excess of about 2 grams per cubic centimeter. In some embodiments, the IC chip further includes a dielectric layer between the pad and the piezoelectric device, wherein the via extends through the dielectric layer, and wherein a rate of diffusion of hydrogen ions through the dielectric layer is more than a rate of diffusion of hydrogen ions through the barrier layer. In some embodiments, the IC chip further includes a second barrier layer between the pad and the piezoelectric device, wherein the via extends through the second barrier layer, and wherein the second barrier layer is configured to block hydrogen ions from diffusing through the second barrier layer, from over the second barrier layer to the piezoelectric device. In some embodiments, the IC chip further includes: a second pad including a first end overlying the piezoelectric device; and a second via extending from the second pad to the piezoelectric device, wherein the barrier layer overlies and is level with the second pad. In some embodiments, the IC chip further includes a getter layer on an underside of the piezoelectric device and configured to getter hydrogen ions.

In some embodiments, the present disclosure provides another IC chip including: a substrate; a piezoelectric structure over the substrate, wherein the piezoelectric structure includes a bottom electrode, a piezoelectric layer overlying the bottom electrode, and a top electrode overlying the piezoelectric layer; a first hydrogen-barrier layer overlying the piezoelectric structure; a pad having a first end and a second end, wherein the first end overlies the first hydrogen-barrier layer and the piezoelectric structure and is electrically coupled to the top or bottom electrode, and wherein the second end is level with the piezoelectric structure; and a second hydrogen-barrier layer overlying the pad and the piezoelectric structure. In some embodiments, the second hydrogen-barrier layer is a metal oxide. In some embodiments, the first hydrogen-barrier layer extends along individual sidewalls respectively of the bottom electrode, the top electrode, and the piezoelectric layer. In some embodiments, the first and second hydrogen-barrier layers share a common density. In some embodiments, the substrate includes a moveable membrane at an opening extending through the substrate, wherein the piezoelectric structure extends in a closed path around the moveable membrane. In some embodiments, the second hydrogen-barrier layer is on a sidewall of the moveable membrane. In some embodiments, the IC chip further includes a passivation layer overlying the second hydrogen-barrier layer, wherein the passivation layer is on a sidewall of the moveable membrane, and wherein the second hydrogen-barrier layer is spaced from the moveable membrane. In some embodiments, the pad is elongated continuously from the first end of the pad to the second end of the pad, wherein the second end is distal from the first end and is laterally offset from the piezoelectric structure. In some embodiments, the IC chip further includes a passivation layer overlying the second hydrogen-barrier layer, wherein the passivation layer and the second hydrogen-barrier layer form a common sidewall at the second end of the pad, and wherein the second end is distal from and laterally offset from the first end and the piezoelectric structure.

In some embodiments, the present disclosure provides a method including: forming a piezoelectric structure over a substrate and including a first electrode, a piezoelectric layer overlying the first electrode, and a second electrode overlying the piezoelectric layer; depositing a dielectric layer covering the piezoelectric structure; forming a pad and a via, wherein the pad overlies the dielectric layer, and wherein the via extends through the dielectric layer, from the pad to the to the piezoelectric structure; depositing a barrier layer covering the pad and the piezoelectric structure; and performing a semiconductor manufacturing process after the depositing of the barrier layer, wherein the semiconductor manufacturing process exposes the barrier layer to ions, and wherein the barrier layer blocks the ions from passing through the barrier layer. In some embodiments, the depositing of the barrier layer is performed without a source of hydrogen, and wherein the ions are hydrogen ions. In some embodiments, the piezoelectric structure extends laterally in a closed path around a central area, wherein the semiconductor manufacturing process includes patterning the substrate to form a plurality of slits at the central area. In some embodiments, the semiconductor manufacturing process includes: depositing a passivation layer covering the barrier layer; and patterning the passivation layer and the barrier layer to form a pad opening exposing an end of the pad laterally offset from the piezoelectric structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC) chip comprising:
a substrate;
a piezoelectric device overlying the substrate;
a pad overlying the piezoelectric device;
a via extending from the pad to the piezoelectric device;
a barrier layer overlying the pad; and
a dielectric layer between the pad and the piezoelectric device, wherein the via extends through the dielectric layer;
wherein the barrier layer is configured to block hydrogen ions from diffusing through the barrier layer, from over the barrier layer to the piezoelectric device.

2. The IC chip according to claim 1, wherein the barrier layer comprises aluminum oxide, titanium oxide, iron oxide, zirconium oxide, zinc oxide, copper oxide, or tantalum oxide.

3. The IC chip according to claim 1, wherein the barrier layer has a density in excess of about 2 grams per cubic centimeter.

4. The IC chip according to claim 1, wherein a rate of diffusion of hydrogen ions through the dielectric layer is more than a rate of diffusion of hydrogen ions through the barrier layer.

5. The IC chip according to claim 1, further comprising:
a second barrier layer between the pad and the piezoelectric device, wherein the via extends through the second barrier layer, and wherein the second barrier layer is configured to block hydrogen ions from diffusing through the second barrier layer, from over the second barrier layer to the piezoelectric device.

6. The IC chip according to claim 1, further comprising:
a second pad comprising a first end overlying the piezoelectric device; and
a second via extending from the second pad to the piezoelectric device, wherein the barrier layer overlies and is level with the second pad.

7. The IC chip according to claim 1, further comprising:
a getter layer on an underside of the piezoelectric device and configured to getter hydrogen ions.

8. An integrated circuit (IC) chip comprising:
a substrate;
a piezoelectric structure over the substrate, wherein the piezoelectric structure comprises a bottom electrode, a piezoelectric layer overlying the bottom electrode, and a top electrode overlying the piezoelectric layer;
a first hydrogen-barrier layer overlying the piezoelectric structure;
a pad having a first end and a second end, wherein the first end overlies the first hydrogen-barrier layer and the piezoelectric structure and is electrically coupled to the top or bottom electrode, and wherein the second end is level with the piezoelectric structure; and
a second hydrogen-barrier layer overlying the pad and the piezoelectric structure.

9. The IC chip according to claim 8, wherein the second hydrogen-barrier layer is a metal oxide.

10. The IC chip according to claim 8, wherein the first hydrogen-barrier layer extends along individual sidewalls respectively of the bottom electrode, the top electrode, and the piezoelectric layer.

11. IC chip according to claim 8, wherein the first and second hydrogen-barrier layers share a common density.

12. The IC chip according to claim 8, wherein the substrate comprises a moveable membrane at an opening extending through the substrate, and wherein the piezoelectric structure extends in a closed path around the moveable membrane.

13. The IC chip according to claim 12, wherein the second hydrogen-barrier layer is on a sidewall of the moveable membrane.

14. The IC chip according to claim 12, further comprising:
a passivation layer overlying the second hydrogen-barrier layer, wherein the passivation layer is on a sidewall of the moveable membrane, and wherein the second hydrogen-barrier layer is spaced from the moveable membrane.

15. The IC chip according to claim 8, wherein the pad is elongated continuously from the first end of the pad to the second end of the pad, and wherein the second end is distal from the first end and is laterally offset from the piezoelectric structure.

16. The IC chip according to claim 8, further comprising:
a passivation layer overlying the second hydrogen-barrier layer, wherein the passivation layer and the second hydrogen-barrier layer form a common sidewall at the second end of the pad, and wherein the second end is distal from and laterally offset from the first end and the piezoelectric structure.

17. A method comprising:
forming a piezoelectric structure over a substrate and comprising a first electrode, a piezoelectric layer overlying the first electrode, and a second electrode overlying the piezoelectric layer;
depositing a dielectric layer covering the piezoelectric structure;
forming a pad and a via, wherein the pad overlies the dielectric layer, and wherein the via extends through the dielectric layer, from the pad to the piezoelectric structure;
depositing a barrier layer covering the pad and the piezoelectric structure; and
performing a semiconductor manufacturing process after the depositing of the barrier layer, wherein the semiconductor manufacturing process exposes the barrier layer to ions, and wherein the barrier layer blocks the ions from passing through the barrier layer.

18. The method according to claim 17, wherein the depositing of the barrier layer is performed without a source of hydrogen, and wherein the ions are hydrogen ions.

19. The method according to claim 17, wherein the piezoelectric structure extends laterally in a closed path around a central area, and wherein the semiconductor manufacturing process comprises patterning the substrate to form a plurality of slits at the central area.

20. The method according to claim 17, wherein the semiconductor manufacturing process comprises:
depositing a passivation layer covering the barrier layer; and
patterning the passivation layer and the barrier layer to form a pad opening exposing an end of the pad laterally offset from the piezoelectric structure.

* * * * *